US012690455B2

(12) United States Patent (10) Patent No.: US 12,690,455 B2
Sasaki et al. (45) Date of Patent: Jul. 21, 2026

(54) SEMICONDUCTOR DEVICE, SEMICONDUCTOR MODULE, AND SYSTEM

(71) Applicant: Murata Manufacturing Co., Ltd., Kyoto-fu (JP)

(72) Inventors: Kenji Sasaki, Nagaokakyo (JP); Satoshi Goto, Nagaokakyo (JP); Masayuki Aoike, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 337 days.

(21) Appl. No.: 18/617,375

(22) Filed: Mar. 26, 2024

(65) Prior Publication Data

US 2024/0332118 A1 Oct. 3, 2024

(30) Foreign Application Priority Data

Mar. 29, 2023 (JP) ................................ 2023-053300

(51) Int. Cl.
*H10W 40/22* (2026.01)
*H03F 3/24* (2006.01)
*H10W 44/20* (2026.01)

(52) U.S. Cl.
CPC ............ *H10W 40/22* (2026.01); *H03F 3/245* (2013.01); *H10W 44/20* (2026.01); *H03F 2200/451* (2013.01); *H10W 44/231* (2026.01)

(58) Field of Classification Search
CPC ... H10W 40/22; H10W 44/20; H10W 44/231; H10W 40/228; H10W 20/43; H10W 40/253; H10W 70/635; H10W 70/65; H10W 72/20; H10W 95/00; H10W 40/25; H10W 90/701; H03F 3/245; H03F 2200/451; H03F 3/195
See application file for complete search history.

(56) References Cited

U.S. PATENT DOCUMENTS 11,211,334 B2 * 12/2021 Lin ...................... H03K 19/094
2016/0155830 A1 * 6/2016 Sasaki .................. H10D 10/821
257/197

(Continued)

FOREIGN PATENT DOCUMENTS

JP 2021-002644 A 1/2021

*Primary Examiner* — Victor A Mandala
(74) *Attorney, Agent, or Firm* — Studebaker Brackett PLLC

(57) ABSTRACT

A composite board includes a first member and a second member on a first surface that is one surface of the first member. A first conductor protrusion protrudes from the second member in a direction in which the first surface faces. A second conductor protrusion protrudes from the composite board in the direction in which the first surface faces. The first member includes a first semiconductor board, and the second member includes a second semiconductor board having lower thermal conductivity than the first semiconductor board. A radio frequency amplifier circuit including first transistors is in the second member. The first conductor protrusion is electrically connected to the first transistors and at least partially overlaps with the first transistors in a plan view of the first surface. The composite board includes a connection part that reaches the first semiconductor board or the second semiconductor board from the second conductor protrusion.

20 Claims, 22 Drawing Sheets

(56)  References Cited

U.S. PATENT DOCUMENTS

| | | | |
|---|---|---|---|
| 2018/0331041 A1* | 11/2018 | Liao | H10W 20/098 |
| 2020/0006536 A1* | 1/2020 | Sasaki | H10D 10/821 |
| 2020/0066627 A1* | 2/2020 | Do | H10D 1/20 |
| 2021/0066479 A1* | 3/2021 | Sasaki | H10D 10/821 |
| 2021/0288039 A1* | 9/2021 | Aoike | H10W 40/228 |
| 2022/0108936 A1* | 4/2022 | Yoshimi | H03F 3/72 |
| 2022/0200548 A1* | 6/2022 | Fukasawa | H03F 1/56 |
| 2022/0376658 A1* | 11/2022 | Hashinaga | H03F 1/0288 |
| 2022/0384326 A1* | 12/2022 | Yang | H10W 70/611 |
| 2023/0299726 A1* | 9/2023 | Goto | H03F 1/0288 |
| 2024/0056082 A1* | 2/2024 | Lin | H03K 19/173 |
| 2024/0304584 A1* | 9/2024 | Chen | H10B 80/00 |
| 2025/0273579 A1* | 8/2025 | Lin | G11C 5/06 |

* cited by examiner

INTERVAL Gp BETWEEN FIRST CONDUCTOR PROTRUSION AND SECOND CONDUCTOR PROTRUSION [μm]

RATE OF CHANGE IN THERMAL RESISTANCE [%]

INTER-CENTER DISTANCE Dy BETWEEN FIRST CONDUCTOR PROTRUSION AND SECOND CONDUCTOR PROTRUSION [μm]

INTERVAL Gp BETWEEN FIRST CONDUCTOR PROTRUSION AND
SECOND CONDUCTOR PROTRUSION [μm]

INTER-CENTER DISTANCE Dy BETWEEN FIRST CONDUCTOR
PROTRUSION AND SECOND CONDUCTOR PROTRUSION [μm]

SEMICONDUCTOR DEVICE, SEMICONDUCTOR MODULE, AND SYSTEM

CROSS-REFERENCE TO RELATED APPLICATION

This application claims benefit of priority to Japanese Patent Application No. 2023-053300, filed Mar. 29, 2023, the entire content of which is incorporated herein by reference.

BACKGROUND

Technical Field

The present disclosure relates to a semiconductor device, a semiconductor module, and a system.

Background Art

A semiconductor device including a second base material on which a circuit element is formed and a first base material having higher thermal conductivity than the second base material has been known as a semiconductor device suitable for high heat dissipation, high output, and a high level of integration as described, for example, in Japanese Unexamined Patent Application Publication No. 2021-002644. The second base material is bonded to the first base material. A conductor pillar bump (conductor protrusion) that is in contact with an electrode connected to the circuit element or with the circuit element and that is electrically connected to the electrode or the circuit element is provided. The conductor pillar bump functions as a heat dissipation path from the circuit element.

SUMMARY

A transistor of a radio frequency amplifier circuit needs to be used without thermal runaway. In a case where heat dissipation from the transistor is not sufficient, output power of the radio frequency amplifier circuit is restricted. In order to increase the output power of the radio frequency amplifier circuit, it is desirable to improve heat dissipation from the transistor. Accordingly, the present disclosure provides a semiconductor device that can improve heat dissipation from a transistor of a radio frequency amplifier circuit. The present disclosure also provides a semiconductor module and a system on which the semiconductor device is mounted.

According to an aspect of the present disclosure, there is provided a semiconductor device including a composite board including a first member and a second member provided on a first surface that is one surface of the first member, a first conductor protrusion that protrudes from the second member in a direction in which the first surface faces, and a second conductor protrusion that protrudes from the composite board in the direction in which the first surface faces. The first member includes a first semiconductor board. The second member includes a second semiconductor board having lower thermal conductivity than the first semiconductor board. A radio frequency amplifier circuit including a plurality of first transistors is provided in the second member. The first conductor protrusion is electrically connected to the plurality of first transistors and at least partially overlaps with the plurality of first transistors in a plan view of the first surface. The composite board includes a connection part that reaches the first semiconductor board or the second semiconductor board from the second conductor protrusion. In the plan view of the first surface, the connection part reaches the first semiconductor board or the second semiconductor board from the second conductor protrusion in a region in which the connection part at least partially overlaps with the second conductor protrusion, and is configured with a semiconductor material, a conductive material, or a laminate of a semiconductor material and a conductive material, and the second conductor protrusion is disposed to be separated by greater than or equal to 55 μm from the first conductor protrusion in an in-plane direction of the first surface.

According to another aspect of the present disclosure, there is provided a semiconductor module including the semiconductor device, and a module board on which the semiconductor device is mounted. The module board includes a ground conductor disposed in a layer, and a plurality of ground lands disposed on an outer surface, and the first conductor protrusion and the second conductor protrusion are connected to the respective ground lands.

According to still another aspect of the present disclosure, there is provided a system including the semiconductor module, and a system board on which the semiconductor module is mounted. The module board includes an inner surface ground conductor disposed on a surface on a side opposite to a surface on which the ground lands are disposed, and a plurality of vias that electrically connect the ground lands to the inner surface ground conductor. The system board includes a system ground conductor disposed on an outer surface, and the semiconductor module is mounted on the system board by electrically connecting the inner surface ground conductor to the system ground conductor.

Heat generated by the first transistors is conducted to the module board through the first conductor protrusion and the second conductor protrusion. In a case where the second conductor protrusion is disposed to be separated by greater than or equal to 55 μm from the first conductor protrusion in the in-plane direction of the first surface, heat dissipation using a heat dissipation path from the first transistors to the first conductor protrusion and the second conductor protrusion is improved.

DETAILED DESCRIPTION

First Example

A semiconductor device according to a first example will be described with reference to the drawings of FIGS. 1 to 9.

Figure 1:
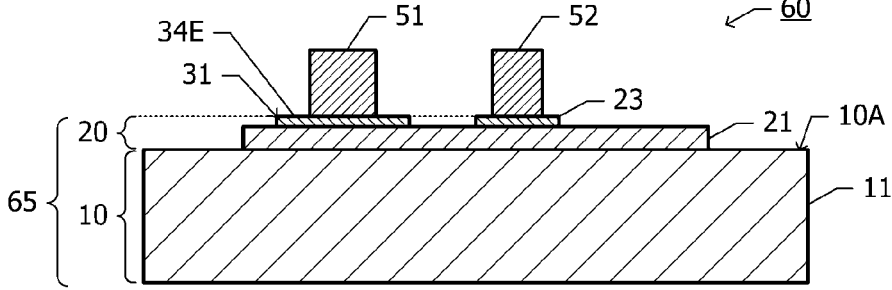
FIG. 1 is a schematic cross-sectional view of a semiconductor device according to a first example.

FIG. 1 is a schematic cross-sectional view of the semiconductor device according to the first example. In the present specification, the term "cross-sectional view" does not mean a drawing illustrating a specific cross-section of a member or a device and means a drawing illustrating characteristic structures of various cross-sections.

A semiconductor device 60 according to the first example includes a composite board 65, a first conductor protrusion 51, and a second conductor protrusion 52. The composite board 65 includes a first member 10 and a second member 20 provided on a first surface 10A of the first member 10. The second member 20 is provided on the first member 10 by, for example, bonding the second member 20 onto the first member 10. Bonding between the first member 10 and the second member 20 is performed by bonding using, for example, Van Der Waals coupling or hydrogen coupling. In addition, both may be bonded using electrostatic force, covalent coupling, eutectic coupling, and the like. Both may be bonded by forming an Au film on the first surface 10A and pressurizing the second member 20 in close contact with the Au film.

The first conductor protrusion 51 and the second conductor protrusion 52 protrude from the composite board 65 in the same direction as a direction in which the first surface 10A faces. More specifically, the first conductor protrusion 51 and the second conductor protrusion 52 protrude from the second member 20 in the same direction as the direction in which the first surface 10A faces. In other words, the second member 20 is sandwiched between the first conductor protrusion 51 and the second conductor protrusion 52 and the first member 10 of the composite board 65, and the first conductor protrusion 51 and the second conductor protrusion 52 protrude to a side opposite to the first member 10 side in a view from the second member 20. For example, a Cu pillar bump is used as the first conductor protrusion 51 and the second conductor protrusion 52. Hereinafter, surfaces of various constituents of the semiconductor device that face in the same direction as the first surface 10A will be referred to as "upper surfaces".

The first member 10 includes a first semiconductor board 11. The second member 20 includes a second semiconductor board 21. The second semiconductor board 21 is thinner than the first semiconductor board 11. Thermal conductivity of the second semiconductor board 21 is lower than thermal conductivity of the first semiconductor board 11. In addition, electron mobility of a semiconductor material of the second semiconductor board 21 is higher than electron mobility of a semiconductor material of the first semiconductor board 11. For example, a single semiconductor such as Si is used for the first semiconductor board 11. For example, a compound semiconductor such as GaAs is used for the second semiconductor board 21. The second semiconductor board 21 is electrically semi-insulating.

The second member 20 further includes a plurality of first transistors 31 disposed on an upper surface of the second semiconductor board 21, emitter wires 34E connected to emitters of the first transistors 31, and a connection part 23. The second member 20 is manufactured by forming the plurality of first transistors 31 and the like on the upper surface of the second semiconductor board 21 and then thinning the second semiconductor board 21 by grinding or polishing from its inner surface before bonding the second semiconductor board 21 to the first member 10. The second semiconductor board 21 has a degree of thinness with which the second semiconductor board 21 cannot maintain a constant shape. A shape of the second semiconductor board 21 is constantly maintained by bonding the second semiconductor board 21 to the first member 10. In a plan view of the first surface 10A (hereinafter, may be simply referred to as "in the plan view"), the second member 20 is smaller than the first member 10 and is included in the first member 10.

The plurality of first transistors 31 are, for example, heterojunction bipolar transistors and are connected in parallel with each other to constitute a radio frequency amplifier circuit. The first conductor protrusion 51 is electrically connected to the first transistors 31. More specifically, the first conductor protrusion 51 is electrically connected to the emitters of the first transistors 31. In addition, in the plan view, the first conductor protrusion 51 at least partially overlaps with the plurality of first transistors 31.

The second conductor protrusion 52 is in contact with an upper surface of the connection part 23, and the connection part 23 is in contact with the upper surface of the second semiconductor board 21. That is, the connection part 23 reaches the second semiconductor board 21 from the second conductor protrusion 52. The connection part 23 is disposed at a position that at least partially overlaps with the second conductor protrusion 52 in the plan view, and is configured with a semiconductor material, a conductive material, or a laminate of a semiconductor material and a conductive material. That is, a heat transfer path that reaches the second conductor protrusion 52 from the first semiconductor board 11 and that is configured with only a semiconductor material, only a conductive material, or only a semiconductor material and a conductive material without including an insulating material is formed in a region surrounded by a peripheral line of the second conductor protrusion 52 in the plan view.

The connection part 23 may include an insulating material at a location other than a location constituting the heat transfer path. For example, the connection part 23 may be configured with a waffle via conductor that is a set of a plurality of via conductors used as the heat transfer path. Each of the via conductors is configured with a semiconductor member, a conductive member, or a laminate member of a semiconductor material and a conductive material. In this case, the connection part 23 includes, in addition to the plurality of via conductors, an insulating member that insulates the plurality of via conductors from each other. However, even in this case, the plurality of via conductors are mainly used as the heat transfer path, and the insulating member actually does not function as the heat transfer path. Accordingly, even in a case where the connection part 23 is configured with a waffle via, the heat transfer path configured with only a semiconductor material, only a conductive material, or only a semiconductor material and a conductive material without including an insulating material is formed.

Figure 2:
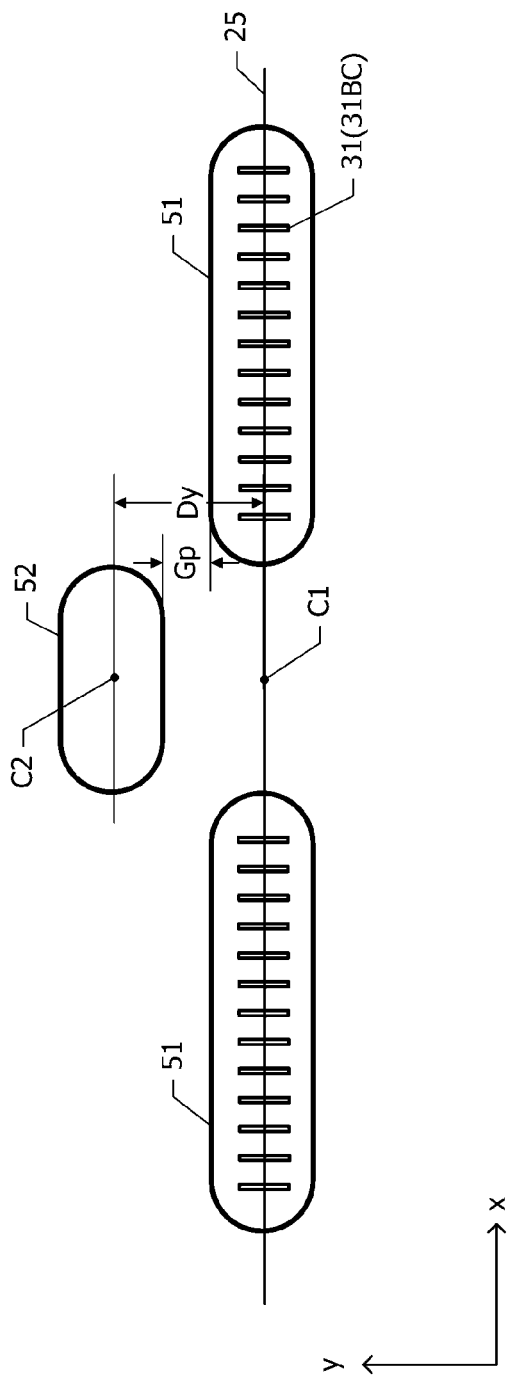
FIG. 2 is a diagram illustrating a positional relationship among a first conductor protrusion, a second conductor protrusion, and first transistors of the semiconductor device according to the first example in a plan view.

FIG. 2 is a diagram illustrating a positional relationship among the first conductor protrusion 51, the second conductor protrusion 52, and the first transistors 31 in the plan view. In FIG. 2, the first transistors 31 are illustrated by shapes of collector mesas 31BC, described later, in the plan view. An xy orthogonal coordinate system in which a plane parallel to the first surface 10A (FIG. 1) of the first member 10 is an xy plane is defined. Along an imaginary straight line 25 parallel to an x axis, 26 first transistors 31 (collector mesas 31BC) are arranged. The 26 first transistors 31 are divided into two blocks, each of which is configured with 13 first transistors 31. The plurality of first transistors 31 belonging to each of the two blocks are arranged at equal intervals. A shortest distance between the plurality of first transistors 31 of one block and the plurality of first transistors 31 of the other block is longer than an arrangement pitch of the plurality of first transistors 31 in the block.

One first conductor protrusion 51 is disposed for each block of the first transistors 31. Each of the first conductor protrusions 51 is electrically connected to the plurality of first transistors 31 of the corresponding block. In the plan view, each of the first conductor protrusions 51 has a shape that is long in an x direction, and includes the plurality of first transistors 31 to which the first conductor protrusion 51 is connected.

The second conductor protrusion 52 is disposed at a position shifted from the first conductor protrusions 51 in an y axis direction and is disposed between the two first conductor protrusions 51 in the x direction. For example, positions of a geometric center C1 of the two first conductor protrusions 51 in the plan view in the x direction and a geometric center of the second conductor protrusion 52 in the plan view in the x direction match each other. A distance between the centers of the first conductor protrusion 51 and the second conductor protrusion 52 in a y direction will be denoted by Dy, and an interval between the first conductor protrusion 51 and the second conductor protrusion 52 in the y direction will be denoted by Gp.

Figure 3A:
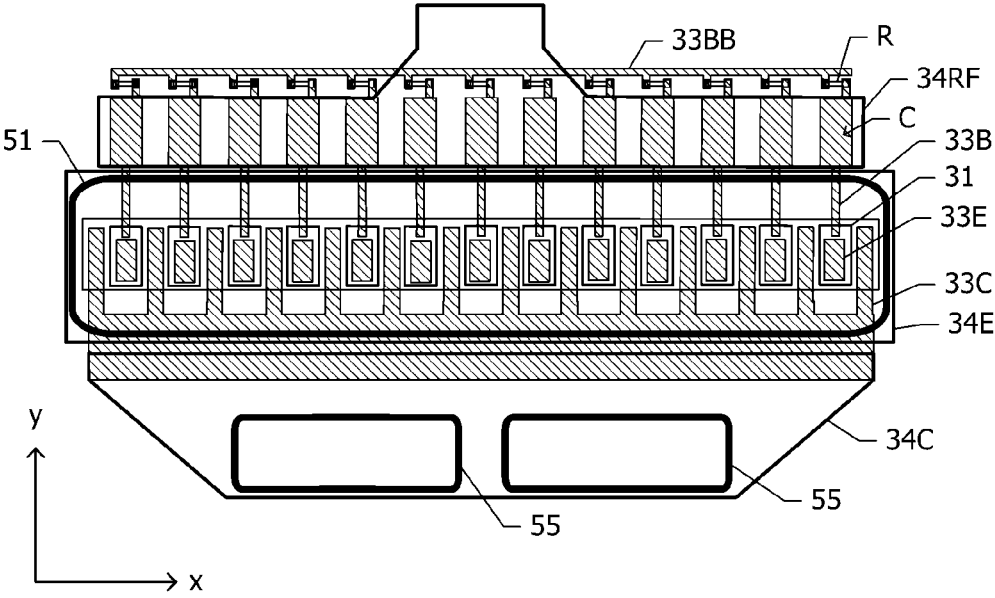
FIG. 3A is a diagram illustrating a positional relationship between a plurality of first transistors included in one block and wires and passive elements connected to the first transistors in the plan view.
Figure 3B:
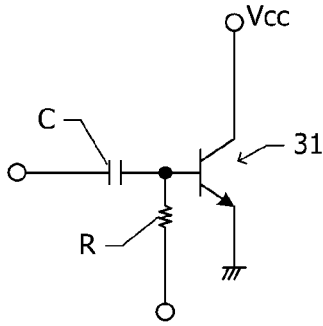
FIG. 3B is an equivalent circuit diagram of one first transistor and the passive element connected to the first transistor.

FIG. 3A is a diagram illustrating a positional relationship between the plurality of first transistors 31 included in one block and wires and passive elements connected to the first transistors 31 in the plan view. FIG. 3B is an equivalent circuit diagram of one first transistor 31 and the passive element connected to the first transistor 31.

As illustrated in FIG. 3B, a collector of the first transistor 31 is connected to a power supply voltage Vcc, and the emitter of the first transistor 31 is grounded. A radio frequency signal is input into a base of the first transistor 31 through an input capacitor C. A base bias is applied to the base of the first transistor 31 through a base ballast resistance element R.

Figure 13:
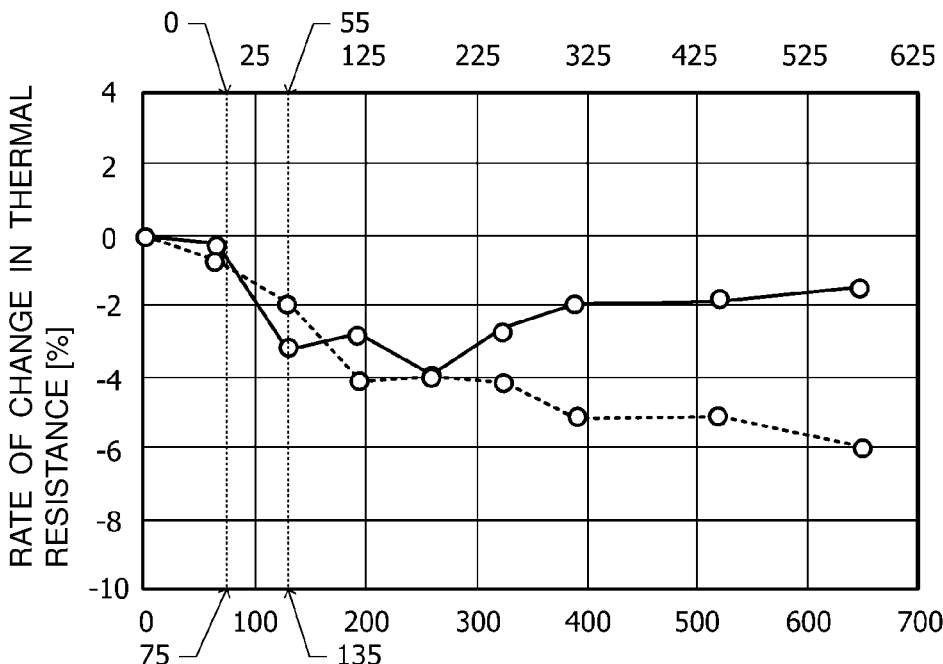
FIG. 13 is a graph illustrating a result of a simulation of a rate of change in thermal resistance using thermal resistance in a case where the inter-center distance Dy is zero as a reference in the system according to the second example.

As illustrated in FIG. 3A, 13 first transistors 31 are arranged in the x direction. In FIG. 3A, wires included in a wire layer of a first layer are hatched in a lower right direction.

Emitter wires 33E of the first layer are disposed such that each of the first transistors 31 includes the emitter wire 33E. The emitter wires 33E are electrically connected to the emitters of the first transistors 31. An emitter wire 34E of a second layer is disposed such that the emitter wire 34E includes the plurality of emitter wires of the first layer in the plan view. The emitter wire 34E of the second layer is connected to the plurality of emitter wires 33E of the first layer and electrically connects the emitters of the plurality of first transistors 31 to each other.

A plurality of comb tooth parts of a collector wire 33C of the first layer having a comb tooth shape are arranged in the x direction, and the first transistors 31 are disposed between two adjacent comb tooth parts. The collector wire 33C is electrically connected to the collectors of the first transistors 31.

A base wire 33B of the first layer extends from each of the first transistors 31 in the y direction. The base wires 33B are electrically connected to the bases of the first transistors 31. Each of the base wires 33B is expanded on an outer side portion of the emitter wire 34E of the second layer. Expanded portions of the plurality of base wires 33B overlap with an input wire 34RF of the second layer in the plan view.

Locations at which both overlaps operate as the input capacitors C. One ends of the base ballast resistance elements R are connected to tip ends of each of the plurality of base wires 33B. The other ends of the base ballast resistance elements R are connected to a common base bias wire 33BB of the first layer.

The first conductor protrusion 51 is disposed such that the first conductor protrusion 51 overlaps with the emitter wire 34E of the second layer in the plan view. The first conductor protrusion 51 is electrically connected to the emitter wire 34E of the second layer. In addition, the first conductor protrusion 51 includes the plurality of first transistors 31 to which the first conductor protrusion 51 is connected in the plan view.

A part of a collector wire 34C of the second layer overlaps with a part of the collector wire 33C of the first layer, and the collector wire 34C is electrically connected to the collector wire 33C of the first layer in the overlapping part. Two output conductor protrusions 55 are disposed such that the collector wire 34C of the second layer includes the output conductor protrusions 55. The output conductor protrusions 55 are electrically connected to the collector wire 34C of the second layer.

Figure 4A:
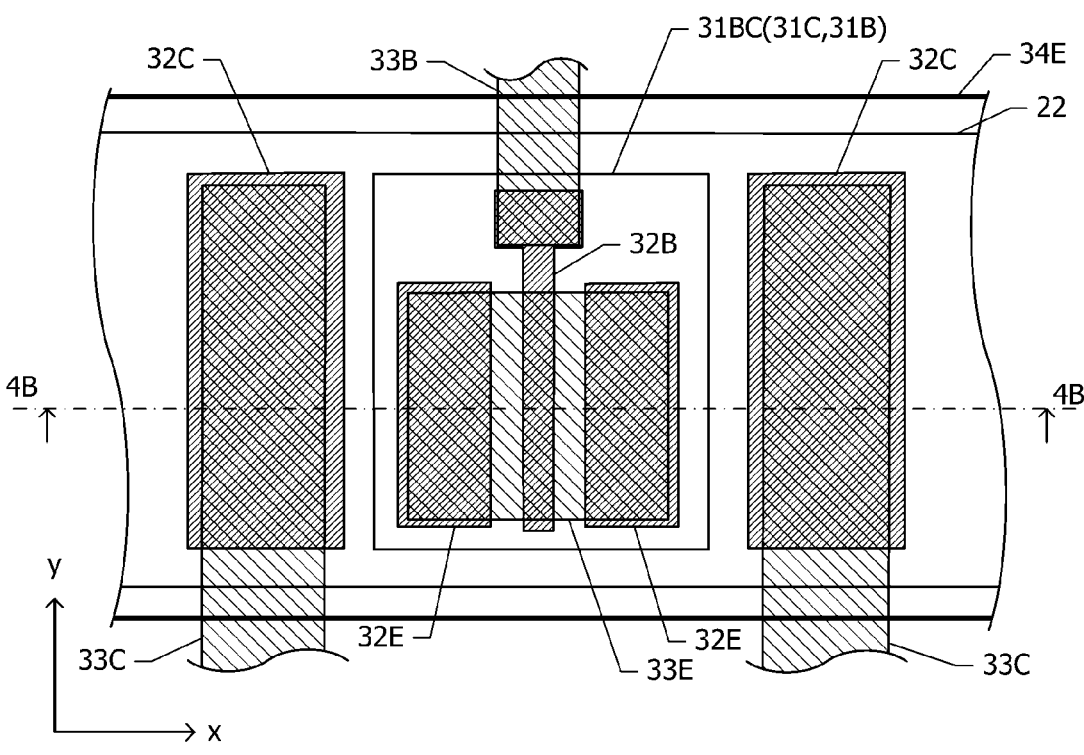
FIG. 4A is a schematic plan view of one first transistor.
Figure 4B:
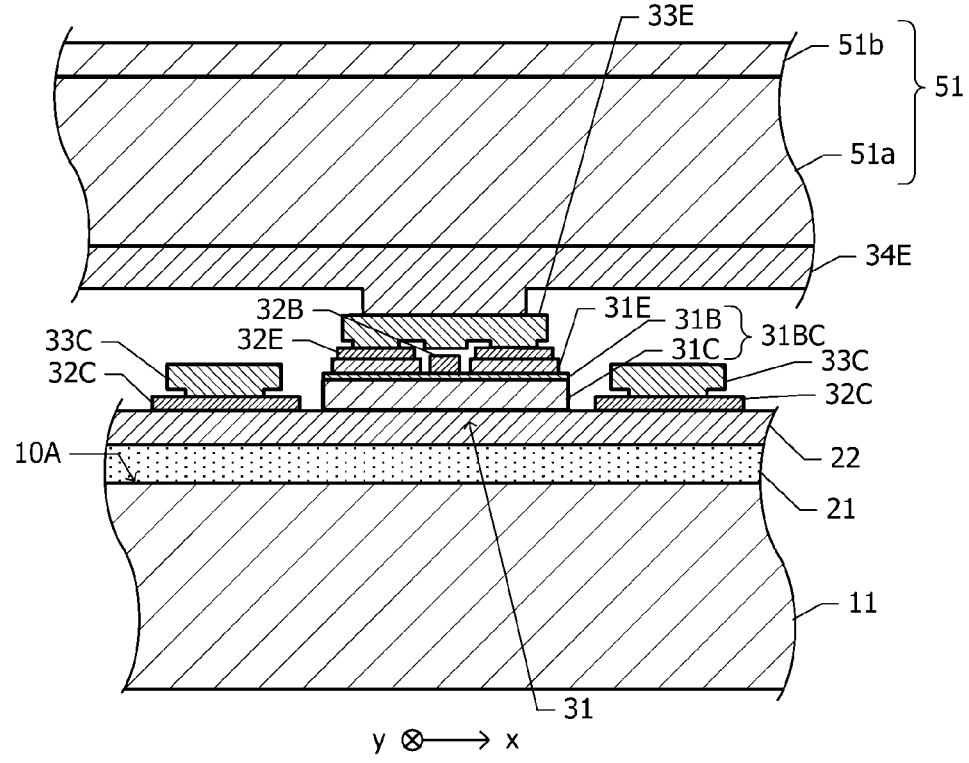
FIG. 4B is a cross-sectional view taken along a dot-dashed line 4B-4B in FIG. 4A.

FIG. 4A is a schematic plan view of one first transistor 31, and FIG. 4B is a cross-sectional view taken along a dot-dashed line 4B-4B in FIG. 4A. In FIG. 4A, electrodes that are in direct contact with a semiconductor layer are hatched to be relatively dark in an upper right direction, and the wires included in the wire layer of the first layer are hatched to be relatively light in the lower right direction. In FIG. 4B, an interlayer insulating film is not illustrated.

As illustrated in FIG. 4B, the second semiconductor board 21 is bonded to the first surface 10A of the first member 10. A subcollector layer 22 is disposed on the upper surface of the second semiconductor board 21. The second semiconductor board 21 is a board consisting of a compound semiconductor, and the subcollector layer 22, for example, is formed by epitaxially growing a layer consisting of the same compound semiconductor as the second semiconductor board 21 on the upper surface of the second semiconductor board 21. That is, the second member 20 includes both of the second semiconductor board 21 and the subcollector layer 22.

The first transistor 31 is disposed on an upper surface of the subcollector layer 22. The first transistor 31 includes a laminate of a collector layer 31C, a base layer 31B, and an emitter layer 31E in order from the subcollector layer 22 side. For example, two emitter layers 31E are arranged at an interval in the x direction on an upper surface of the base layer 31B. In the present specification, a mesa structure consisting of the collector layer 31C and the base layer 31B will be referred to as the collector mesa 31BC. In addition, overlapping with the first transistor 31 in the plan view means overlapping with the collector mesa 31BC. Each of the collector mesas 31BC has a shape that is long in the y direction in the plan view.

An emitter electrode 32E is disposed on each of the two emitter layers 31E. A base electrode 32B is disposed in a region between the two emitter layers 31E on the upper surface of the base layer 31B. Two collector electrodes 32C are disposed such that the collector mesa 31BC is interposed between the collector electrodes 32C in the x direction on the upper surface of the subcollector layer 22. The collector electrodes 32C are electrically connected to the collector layer 31C through the subcollector layer 22. The collector electrodes 32C are disposed between two first transistors 31 arranged in the x direction and are shared by the two first transistors 31.

The emitter wire 33E of the first layer is disposed on the two emitter electrodes 32E. The emitter wire 33E passes above the base electrode 32B and electrically connects the two emitter electrodes 32E to each other. The collector wire 33C of the first layer is disposed on the collector electrodes 32C.

The emitter wire 34E of the second layer is electrically connected to the emitter wire 33E of the first layer. The first conductor protrusion 51 is disposed on the emitter wire 34E of the second layer. The first conductor protrusion 51 includes a pillar portion 51a and a solder layer 51b disposed on an upper surface of the pillar portion 51a. An under bump metal layer may be disposed between the pillar portion 51a and the emitter wire 34E of the second layer, as necessary.

As illustrated in FIG. 4A, in the plan view, the collector mesa 31BC consisting of the collector layer 31C and the base layer 31B is disposed in the subcollector layer 22. The two collector electrodes 32C are disposed such that the collector mesa 31BC is interposed between the collector electrodes 32C in the x direction. The comb tooth parts of the collector wire 33C of the first layer overlap with each of the collector electrodes 32C. The comb tooth parts of the collector wire 33C of the first layer extend to an outer side portion of the subcollector layer 22 in a negative direction of a y axis.

The two emitter electrodes 32E that are long in the y direction are arranged at an interval in the x direction inside the collector mesa 31BC, and the base electrode 32B that is long in the y direction is disposed between the two emitter electrodes 32E. One emitter wire 33E of the first layer is disposed to overlap with the two emitter electrodes 32E. The emitter wire 33E of the first layer reaches one emitter electrode 32E from another emitter electrode 32E by intersecting with the base electrode 32B. The base wire 33B of the first layer is disposed to overlap with an end portion of the base electrode 32B. The base wire 33B of the first layer extends to the outer side portion of the subcollector layer 22 in a positive direction of the y axis.

The emitter wire 34E of the second layer is disposed to overlap with the emitter wire 33E of the first layer. The emitter wire 34E of the second layer extends in the x direction and connects the emitter wires 33E of the first layer disposed for each first transistor 31 to each other.

Figure 5A:
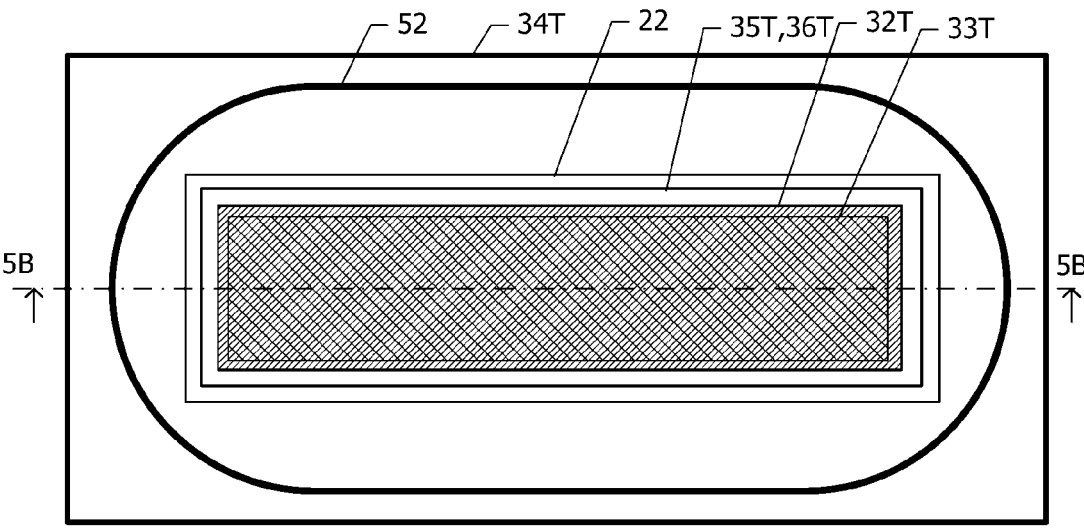
FIG. 5A is a diagram illustrating a positional relationship between the second conductor protrusion and a plurality of constituents connected to the second conductor protrusion in the plan view.
Figure 5B:
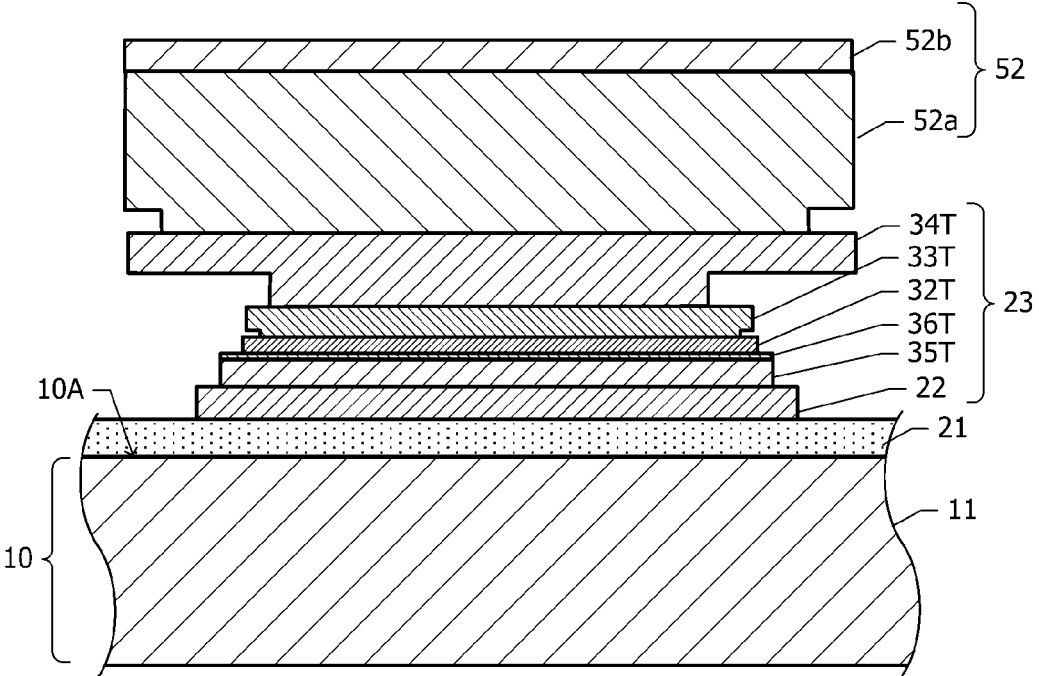
FIG. 5B is a cross-sectional view taken along a dot-dashed line 5B-5B in FIG. 5A.

FIG. 5A is a diagram illustrating a positional relationship between the second conductor protrusion 52 and a plurality of constituents connected to the second conductor protrusion 52 in the plan view, and FIG. 5B is a cross-sectional view taken along a dot-dashed line 5B-5B in FIG. 5A. In FIG. 5A, a metal film that is in direct contact with the semiconductor layer is hatched to be relatively dark in the upper right direction, and the wires disposed in the wire layer of the first layer are hatched to be relatively light in the lower right direction. In FIG. 5B, an interlayer insulating film is not illustrated.

As illustrated in FIG. 5B, the second semiconductor board 21 is bonded to the first surface 10A of the first semiconductor board 11 of the first member 10, and the subcollector layer 22 is disposed on the second semiconductor board 21. A laminate of semiconductor layers 35T and 36T and a metal layer 32T in this order is provided on the subcollector layer 22. The semiconductor layers 35T and 36T are deposited in the same deposition step as the collector layer 31C and the base layer 31B of the first transistor 31 (FIG. 4B), respectively. The metal layer 32T is formed in the same step as formation of the base electrode 32B.

A laminate of a metal layer 33T disposed in the wire layer of the first layer and a metal layer 34T disposed in a wire layer of the second layer is provided on the metal layer 32T, and the second conductor protrusion 52 is disposed on the laminate of the metal layer 33T and the metal layer 34T. Like the first conductor protrusion 51 (FIG. 4B), the second conductor protrusion 52 includes a pillar portion 52a and a solder layer 52b disposed on the pillar portion 52a.

As illustrated in FIG. 5A, the subcollector layer 22, the semiconductor layers 35T and 36T, the metal layer 32T, the metal layer 33T of the first layer, the metal layer 34T of the second layer, and the second conductor protrusion 52 overlap with each other in the plan view. A laminate structure consisting of the subcollector layer 22, the semiconductor layers 35T and 36T, the metal layer 32T, the metal layer 33T of the first layer, the metal layer 34T of the second layer, and the second conductor protrusion 52 constitutes the connection part 23 (FIGS. 1 and 5B).

The connection part 23 reaches the first semiconductor board 11 from the second conductor protrusion 52 and is disposed at a position that overlaps with the second conductor protrusion 52 in the plan view. That is, the connection part 23 constitutes a heat transfer path for transferring heat in a direction normal to the first surface 10A from the first semiconductor board 11 to the second conductor protrusion 52.

Figures 6A, 6B:
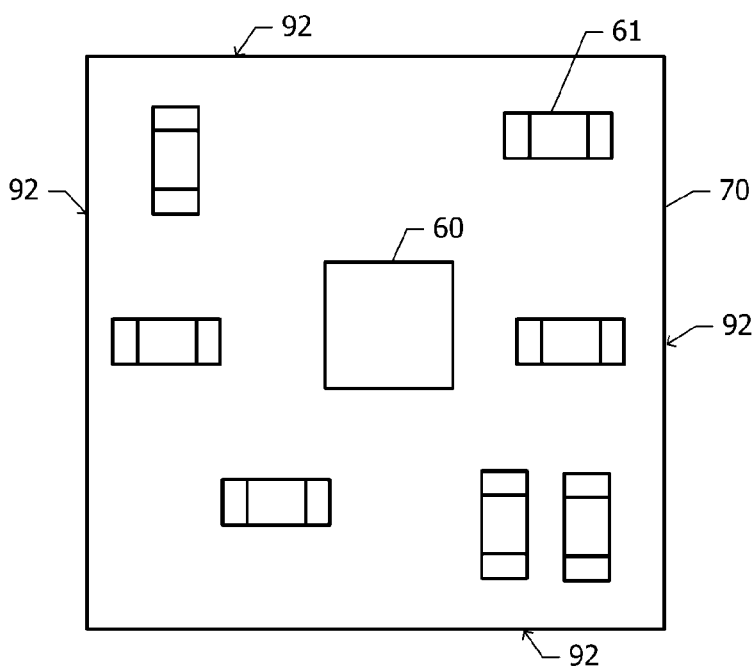
FIGS. 6A and 6B are a plan view and a cross-sectional view, respectively, of a semiconductor module including the semiconductor device.

FIGS. 6A and 6B are a plan view and a cross-sectional view, respectively, of a semiconductor module including the semiconductor device 60. The semiconductor device 60 is mounted on a module board 70. For example, a printed wiring board or a low temperature co-fired ceramic (LTCC) board is used for the module board 70. The module board 70 includes a plurality of in-layer ground conductors 71 disposed in a layer, an inner surface ground conductor 72 disposed on an inner surface, a ground land 73 disposed on a mounting surface, a plurality of other lands 74, and a plurality of vias 75.

The ground land 73 is electrically and thermally connected to the inner surface ground conductor 72 through the plurality of vias 75 and the in-layer ground conductors 71. The semiconductor device 60 is mounted face-down on the module board 70 by connecting the first conductor protrusion 51 and the second conductor protrusion 52 of the semiconductor device 60 to the ground land 73. A plurality of outer surface mounting devices 61 are connected to the plurality of lands 74. A solder layer 76 is disposed on an outer surface of the inner surface ground conductor 72.

Next, a result of a simulation of heat dissipation characteristics of the semiconductor module illustrated in FIGS. 6A and 6B will be described. An imaginary plane 90 positioned above the mounting surface of the module board 70 by approximately 1 mm and an imaginary plane 91 including an outer surface of the solder layer 76 are set as infinite heat dissipation planes having ideal heat dissipation, and imaginary planes 92 surrounding a region in which semiconductor device 60 and the plurality of outer surface mounting devices 61 are disposed in the plan view are set as heat insulating planes. A cavity part of a space surrounded by the imaginary planes 90, 91, and 92 is filled with air. The collector mesas 31BC (FIGS. 4A and 4B) of the plurality of first transistors 31 are set as heat generation sources.

Thermal conductivity of the first member 10 (FIG. 1) of the semiconductor device 60 is set to 148 W/K·m, considering Si. Thermal conductivity of the second semiconductor board 21 of the second member 20, the first transistor 31, and the connection part 23 (FIG. 1) is set to 30 W/K·m, considering GaAs. Thermal conductivity of the pillar portions 51a and 52a of the first conductor protrusion 51 and the second conductor protrusion 52 (FIG. 1) is set to 390 W/Km, considering Cu. Thermal conductivity of an insulating layer part of the module board 70 is set to 0.8 W/Km, considering an epoxy resin. Thermal conductivity of a metal part of the module board 70 is set to 390 W/K·m, considering Cu. Thermal conductivity of the solder layer 51b of the first conductor protrusion 51, the solder layer 52b of the second conductor protrusion 52, and the solder layer 76 is set to 62.8 W/K·m, considering solder. Thermal conductivity of air is set to 0.025 W/K·m.

Figure 7:
FIG. 7 is a graph illustrating a result of a simulation of a rate of change in thermal resistance using thermal resistance in a case where an inter-center distance Dy is zero as a reference.
Figure 7:
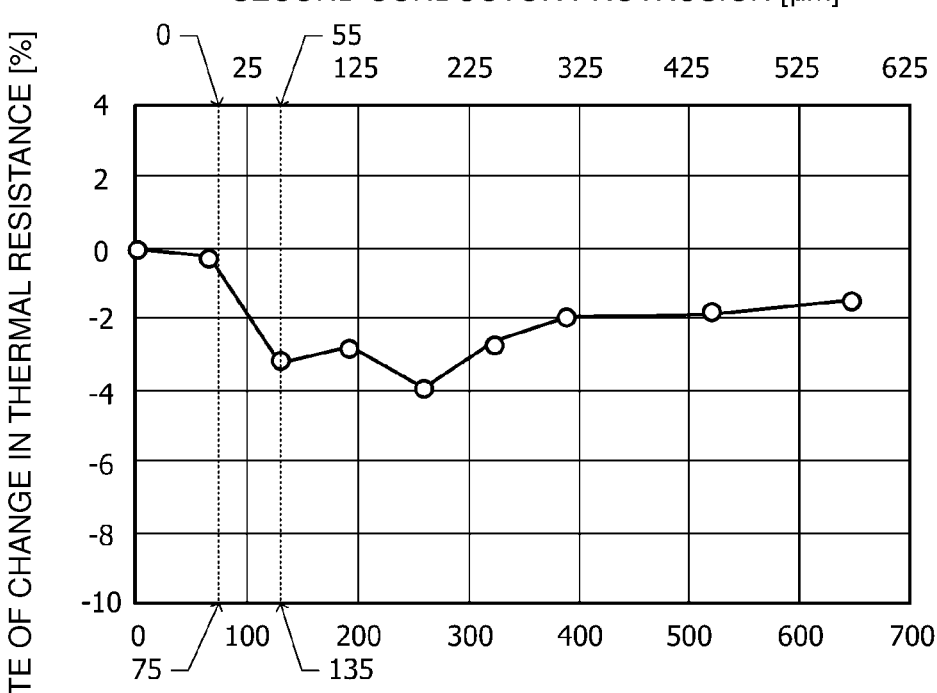

FIG. 7 is a graph illustrating a result of a simulation of a rate of change in thermal resistance using thermal resistance in a case where the inter-center distance Dy (FIG. 2) is zero as a reference. Here, thermal resistance is a value obtained by dividing an increase in a temperature of the collector mesa 31BC by power consumption. In the graph illustrated in FIG. 7, a horizontal axis denotes the inter-center distance Dy (FIG. 2) between the first conductor protrusion 51 and the second conductor protrusion 52 in the y direction in units of [μm], and a vertical axis denotes the rate of change in thermal resistance in units of [%]. An upper horizontal axis denotes a value of the interval Gp (FIG. 2) between the first conductor protrusion 51 and the second conductor protrusion 52 in the y direction.

The rate of change in thermal resistance is negative in a case where the inter-center distance Dy is in a range greater than 0 μm. That is, heat dissipation from the collector mesa 31BC is improved, compared to that in a case where the inter-center distance Dy is zero. Particularly, a degree of improvement in heat dissipation is high in a case where the inter-center distance Dy is greater than or equal to 135 μm, that is, in a case where the interval Gp is greater than or equal to 55 μm. In order to secure high heat dissipation, it is preferable to set the interval Gp to be higher than or equal to 55 μm. In addition, improvement in heat dissipation is confirmed in a case where the interval Gp is in a range of greater than or equal to 55 μm and less than or equal to 575 μm (i.e., from 55 μm to 575 μm).

Figures 8A, 8B, 8C:
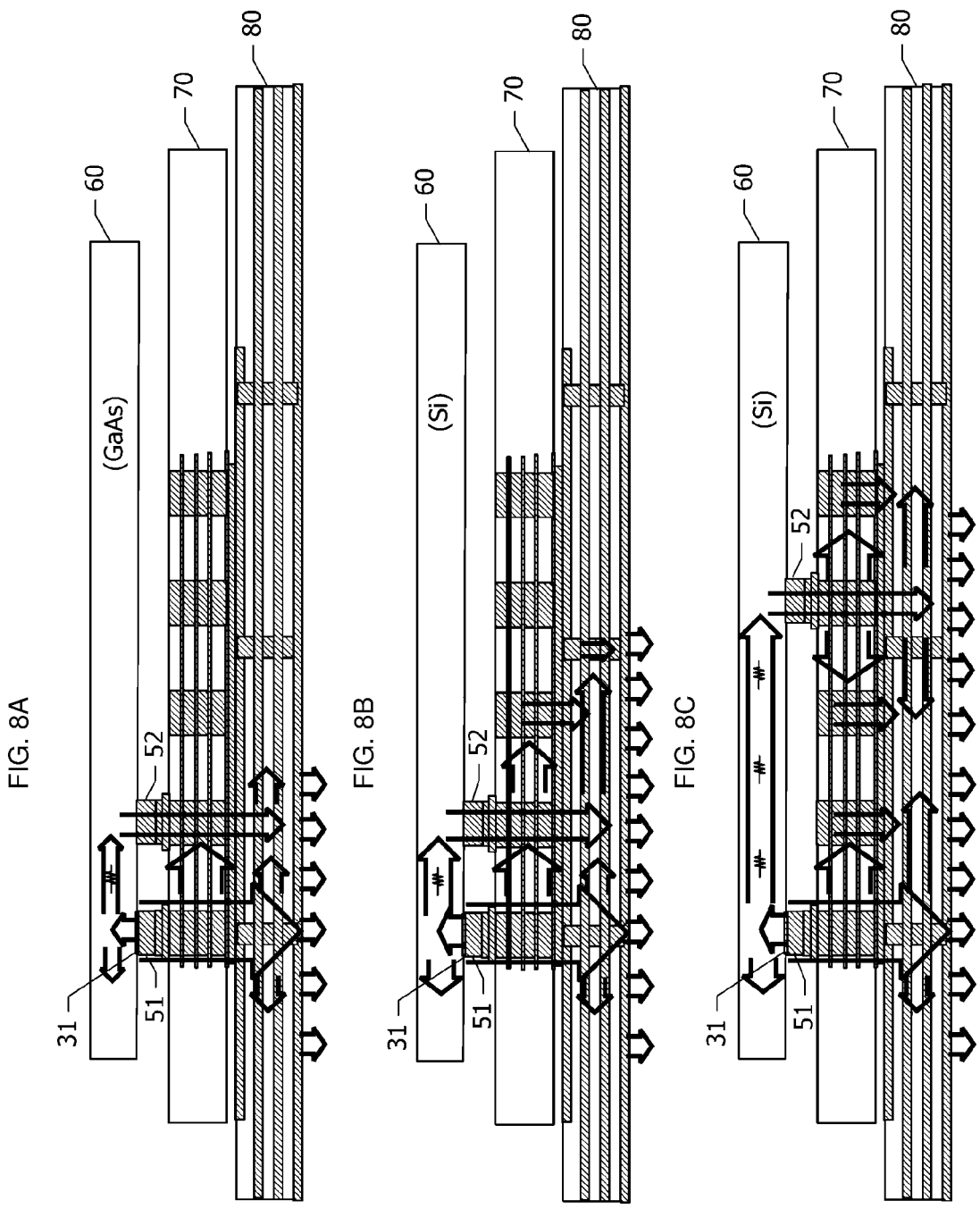
FIGS. 8A, 8B, and 8C are schematic cross-sectional views of evaluation models including the semiconductor device, a module board, and a system board for describing a heat dissipation path from a heat generation location.

Next, a reason for improvement in heat dissipation will be described with reference to FIGS. 8A, 8B, and 8C. FIGS. 8A, 8B, and 8C are schematic cross-sectional views of evaluation models including the semiconductor device 60, the module board 70, and a system board 80 for describing a heat dissipation path from a heat generation location. The semiconductor device 60 is mounted on the module board 70, and the module board 70 is mounted on the system board 80. In FIGS. 8A, 8B, and 8C, a main heat transfer path is illustrated by arrows. A magnitude of an amount of heat transfer is illustrated by thickness of the arrows.

Even in the semiconductor device 60 in any of FIGS. 8A, 8B, and 8C, the first conductor protrusion 51 is disposed at a position that overlaps with the first transistor 31 as the heat generation source, and the second conductor protrusion 52 is disposed at a position separated from the first conductor protrusion 51. In the evaluation model in FIG. 8C, a distance from the first conductor protrusion 51 to the second conductor protrusion 52 is long, compared to those in the evaluation models in FIGS. 8A and 8B.

For example, GaAs is used for the board of the semiconductor device 60 in FIG. 8A. For example, Si is used for the board of the semiconductor device 60 in FIGS. 8B and 8C. The thermal conductivity of the board of the semiconductor device 60 in FIGS. 8B and 8C is higher than the thermal conductivity of the board of the semiconductor device 60 in FIG. 8A.

In the evaluation model in FIG. 8B, heat generated by the first transistor 31 is likely to diffuse through the semiconductor device 60 in a lateral direction, compared to that in the evaluation model in FIG. 8A. Thus, an amount of heat conducted to the module board 70 through the second conductor protrusion 52 is increased. Consequently, an amount of heat that diffuses through the module board 70 in the lateral direction from a location at which the second conductor protrusion 52 is connected is increased. Causing the heat that reaches the module board 70 through the second conductor protrusion 52 to diffuse through the module board 70 in the lateral direction widens an actual area in which the heat is conducted from the module board 70 to the system board 80 in a connection region between the module board 70 and the system board 80. Thus, in the evaluation model in FIG. 8B, heat dissipation is improved, compared to that in the evaluation model in FIG. 8A.

In the evaluation model in FIG. 8B, locations at which the first conductor protrusion 51 and the second conductor protrusion 52 are connected to the module board 70 are close to each other. Thus, a flow of heat from the location at which the first conductor protrusion 51 is connected to the location at which the second conductor protrusion 52 is connected in the module board 70 is formed. Consequently, a temperature gradient in which a temperature is increased from the location at which the second conductor protrusion 52 is connected to the location at which the first conductor protrusion 51 is connected in the module board 70 is generated. Thus, the heat that reaches the module board 70 through the second conductor protrusion 52 is not transferred to the location at which the first conductor protrusion 51 is connected, and diffuses only in a direction away from the location at which the first conductor protrusion 51 is connected.

In the evaluation model in FIG. 8C, thermal resistance of a heat path that passes through the semiconductor device 60 from the first transistor 31 to the second conductor protrusion 52 is increased, compared to that in the evaluation model in FIG. 8B. However, since a distance from the location at which the first conductor protrusion 51 is connected to the location at which the second conductor protrusion 52 is connected is long, most of the heat that reaches the location at which the first conductor protrusion 51 is connected in the module board 70 is conducted to the system board 80 before reaching the location at which the second conductor protrusion 52 is connected. Thus, a thermal effect on the location at which the second conductor protrusion 52 is connected is small.

The heat that reaches the module board 70 through the second conductor protrusion 52 also diffuses in a direction from the location at which the second conductor protrusion 52 is connected to the location at which the first conductor protrusion 51 is connected in the module board 70. Consequently, the actual area in which the heat is conducted from the module board 70 to the system board 80 in the connection region between the module board 70 and the system board 80 is further widened. Accordingly, heat dissipation from the first transistor 31 to the system board 80 is improved. As illustrated in FIG. 7, a noticeable effect of improvement in heat dissipation can be obtained in a case where the interval Gp between the first conductor protrusion 51 and the second conductor protrusion 52 is greater than or equal to 55 µm.

Figure 9:
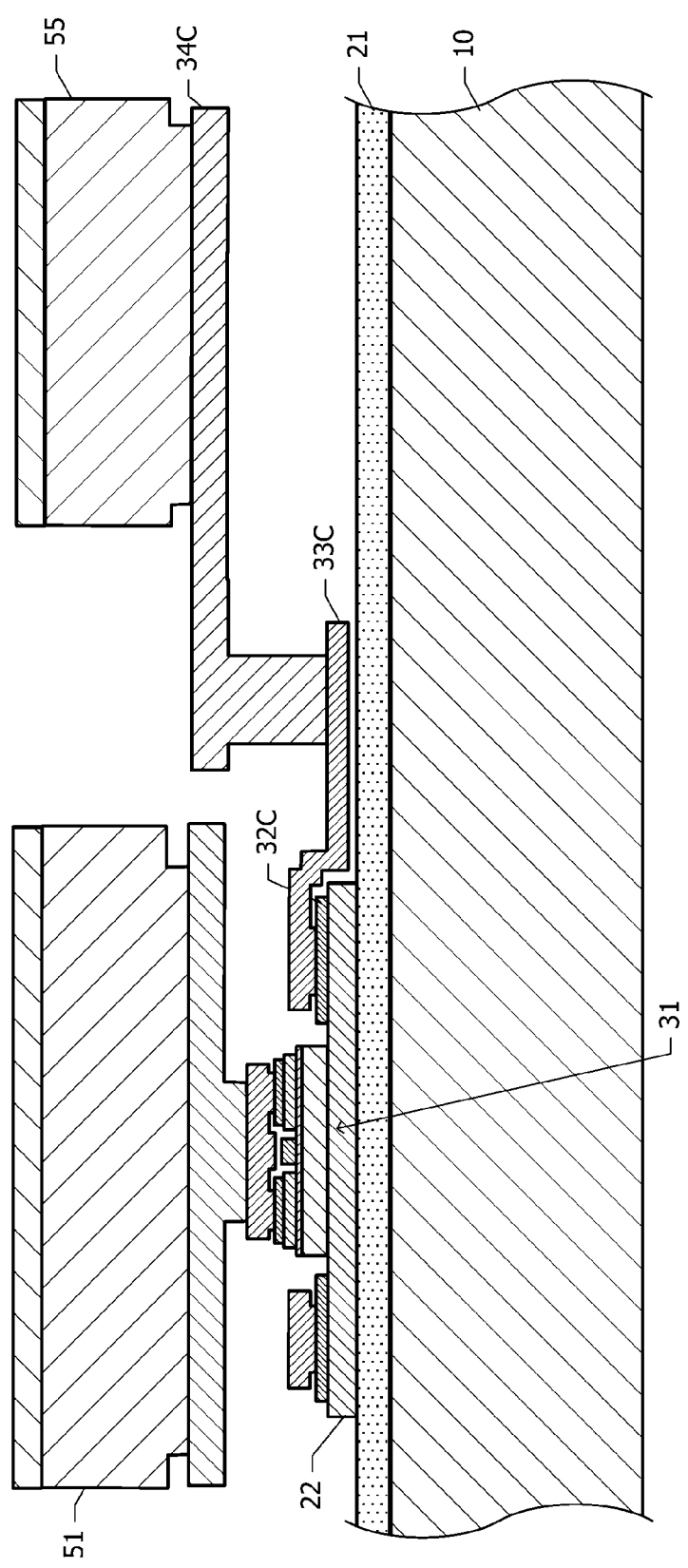
FIG. 9 is a partial cross-sectional view including the first conductor protrusion and an output conductor protrusion of the semiconductor device according to the first example.

Next, differences between the second conductor protrusion 52 and the output conductor protrusions 55 (FIG. 3A) will be described with reference to FIG. 9. FIG. 9 is a partial cross-sectional view including the first conductor protrusion 51 and the output conductor protrusion 55 of the semiconductor device according to the first example. The output conductor protrusion 55 is thermally connected to the second semiconductor board 21 through the collector wire 34C of the second layer, the collector wire 33C of the first layer, the collector electrode 32C, and the subcollector layer 22. In the plan view, the collector wire 33C of the first layer extends to an outer side portion of the output conductor protrusion 55 and is connected to the collector electrode 32C on the outer side portion of the output conductor protrusion 55.

In the plan view, an insulating layer disposed between the second semiconductor board 21 and the collector wire 33C of the first layer expands across the entire range occupied by the output conductor protrusion 55. Accordingly, the output conductor protrusion 55 does not have a part corresponding to the connection part 23 (FIG. 5B) disposed between the second conductor protrusion 52 and the second semiconductor board 21. From this point, the second conductor protrusion 52 is distinguished from the output conductor protrusion 55.

A part of the heat generated by the first transistor 31 is conducted to the output conductor protrusion 55 through the collector electrode 32C and the collector wires 33C and 34C. In the first example, since the second conductor protrusion 52 for heat dissipation is provided in addition to the output conductor protrusion 55 (FIG. 3A), heat dissipation can be improved. Considering thermal symmetry, it is preferable to dispose the second conductor protrusion 52 on a side opposite to the output conductor protrusion 55 in a view from the imaginary straight line 25 (FIG. 2) along which the plurality of first transistors 31 are arranged.

Figures 10A, 10B:
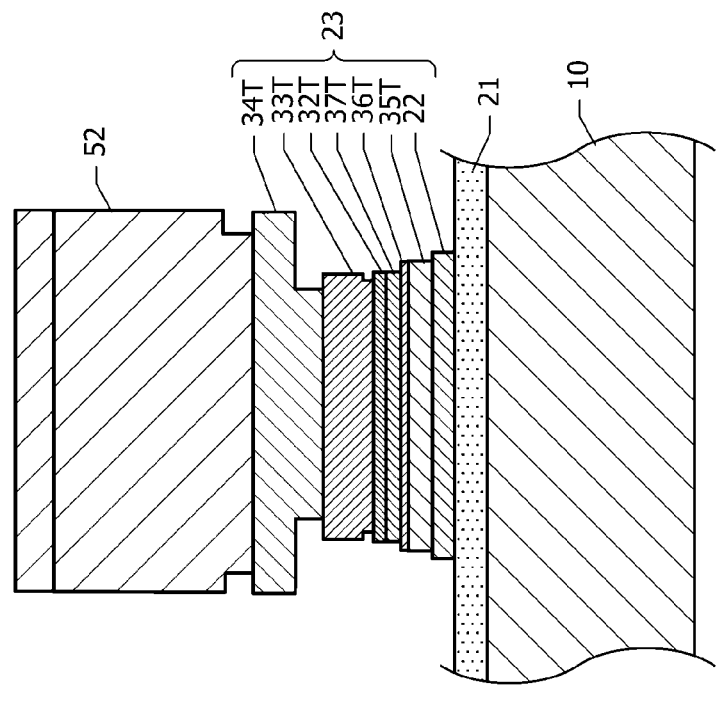
FIGS. 10A and 10B are cross-sectional views of a second conductor protrusion, a connection part, a second semiconductor board, and a first member of a semiconductor device according to a modification example of the first example.

Next, a semiconductor device according to a modification example of the first example will be described with reference to FIGS. 10A and 10B. FIGS. 10A and 10B are cross-sectional views of the second conductor protrusion 52, the connection part 23, the second semiconductor board 21, and the first member 10 of the semiconductor device according to the modification example of the first example. In the first example (FIG. 5B), the metal layer 32T deposited in the same step as the base electrode 32B (FIG. 4B) is in contact with an upper surface of the semiconductor layer 36T deposited in the same step as the base layer 31B (FIG. 4B).

Meanwhile, in the modification example illustrated in FIG. 10A, the semiconductor layer 37T deposited in the same step as the emitter layers 31E (FIG. 4B) is disposed on the semiconductor layer 36T deposited in the same step as the base layer 31B. The metal layer 32T deposited in the same step as the emitter electrodes 32E (FIG. 4B) is in contact with the upper surface of the semiconductor layer 37T. In this configuration, the connection part 23 is configured with the subcollector layer 22, the semiconductor layers 35T, 36T, and 37T, and the metal layers 32T, 33T, and 34T.

The connection part 23 according to the modification example illustrated in FIG. 10B does not include the semiconductor layers 35T and 36T included in the connection part 23 according to the first example (FIG. 5B). That is, the metal layer 32T is in contact with the upper surface of the subcollector layer 22. The metal layer 32T is deposited in the same step as the collector electrode 32C, the base electrode 32B, or the emitter electrodes 32E.

Accordingly, the connection part 23 may have various laminate structures that include a semiconductor layer or a metal layer and that does not include an insulating layer.

Next, a semiconductor device according to another modification example of the first example will be described with reference to FIG. 11.

Figure 11:
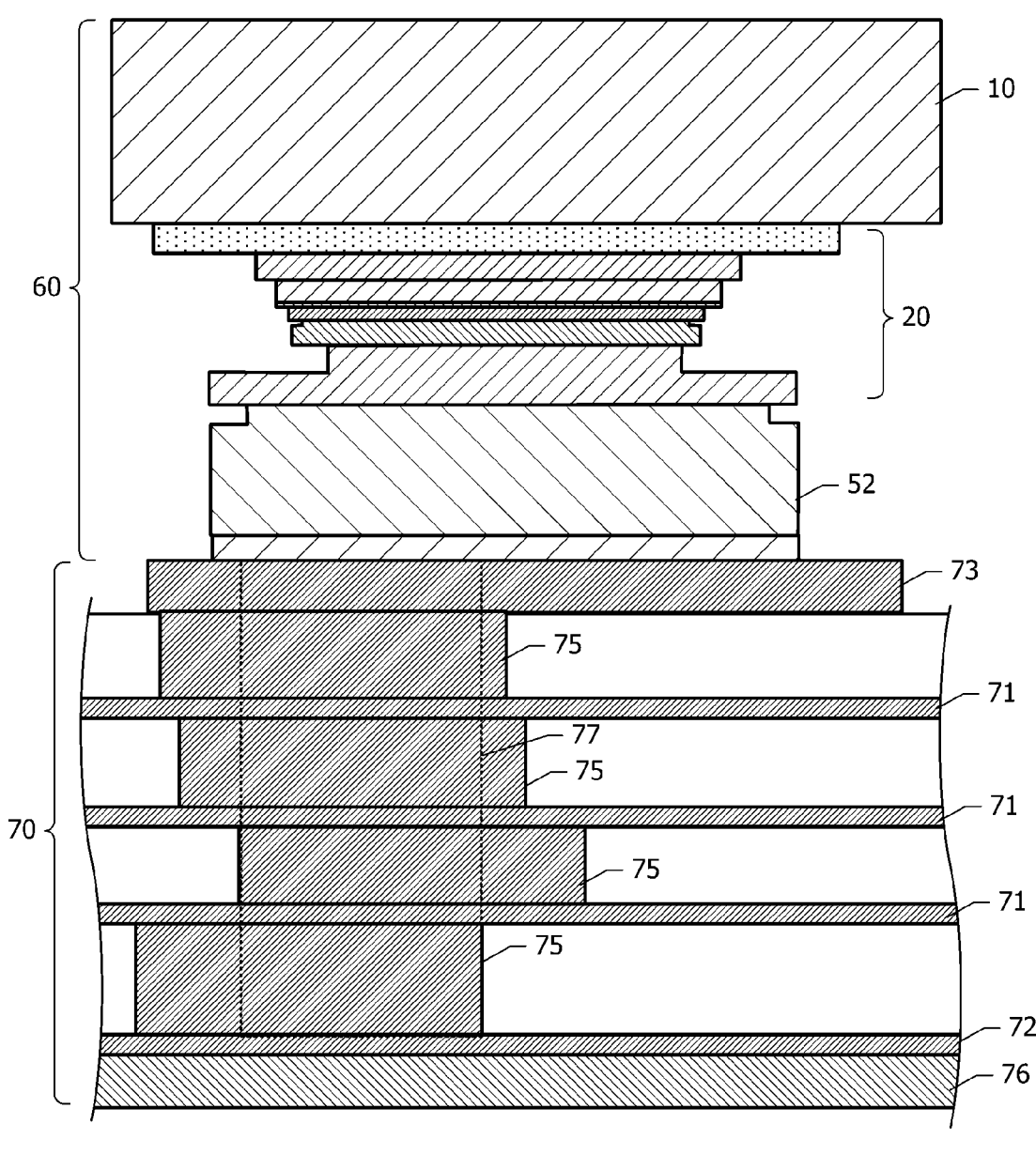
FIG. 11 is a partial cross-sectional view of a semiconductor device and a module board according to another modification example of the first example.

FIG. 11 is a partial cross-sectional view of the semiconductor device 60 and the module board 70 according to the present modification example. In the first example (FIG. 6B), a positional relationship between the second conductor protrusion 52 and the vias 75 in the module board 70 is not particularly defined. In the present modification example, a preferable positional relationship between both is defined.

The second conductor protrusion 52 of the semiconductor device 60 is connected to the ground land 73 of the module board 70. The ground land 73 is electrically and thermally connected to the inner surface ground conductor 72 through the plurality of vias 75 and the plurality of in-layer ground conductors 71. As illustrated by a broken line 77 in FIG. 11, the plurality of vias 75 and the plurality of in-layer ground conductors 71 are disposed such that the inner surface ground conductor 72 can be reached from the second conductor protrusion 52 through only the ground land 73, the vias 75, and the in-layer ground conductors 71 in a thickness direction of the module board 70.

In the modification example illustrated in FIG. 11, since the ground land 73, the vias 75, and the in-layer ground conductors 71 in a region illustrated by the broken line 77 function as the shortest heat transfer path from the second conductor protrusion 52 to the inner surface ground conductor 72, thermal resistance from the second conductor protrusion 52 to the inner surface ground conductor 72 is decreased. Thus, heat dissipation of the semiconductor device 60 from the first transistor 31 through the second conductor protrusion 52 can be improved.

Next, still another modification example of the first example will be described.

In the first example, the plurality of first transistors 31 are divided into two blocks, and the first conductor protrusion 51 is disposed for each block. As another configuration, all of the first transistors 31 may be arranged at equal intervals in the x direction without dividing the plurality of first transistors 31 into two blocks. In this case, one first conductor protrusion 51 that includes all of the first transistors 31 in the plan view may be disposed.

In the first example, total 26 first transistors 31 belonging to the two blocks are connected in parallel with each other to constitute the radio frequency amplifier circuit. As another configuration, the plurality of first transistors 31 may constitute a differential amplifier circuit. In this case, for example, the plurality of first transistors 31 belonging to one block may be connected in parallel with each other to constitute a radio frequency amplifier circuit of a non-inverted signal, and the plurality of first transistors 31 belonging to the other block may be connected in parallel with each other to constitute a radio frequency amplifier circuit of an inverted signal.

Accordingly, not all of the first transistors 31 that use one second conductor protrusion 52 as the heat dissipation path need to be connected in parallel with each other. A part of the plurality of first transistors 31 that use one second conductor protrusion 52 as the heat dissipation path may be connected in parallel with each other, and another part of the plurality of first transistors 31 may be connected in parallel with each other.

Second Example

Next, a system according to a second example will be described with reference to FIGS. 12A, 12B, and 13. The system according to the second example includes the semiconductor device 60 and the module board 70 according to the first example.

Figure 12A:
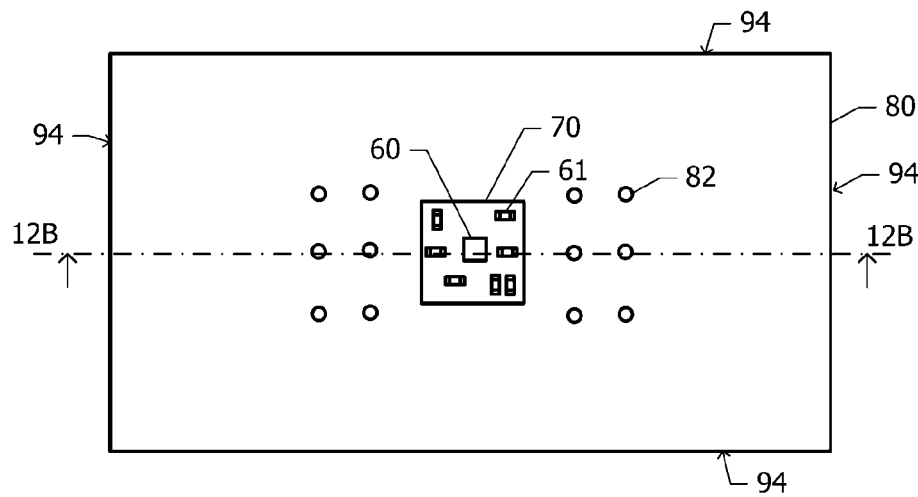
FIG. 12A is a diagram illustrating a positional relationship among a plurality of constituents of a system according to a second example in the plan view.
Figure 12B:
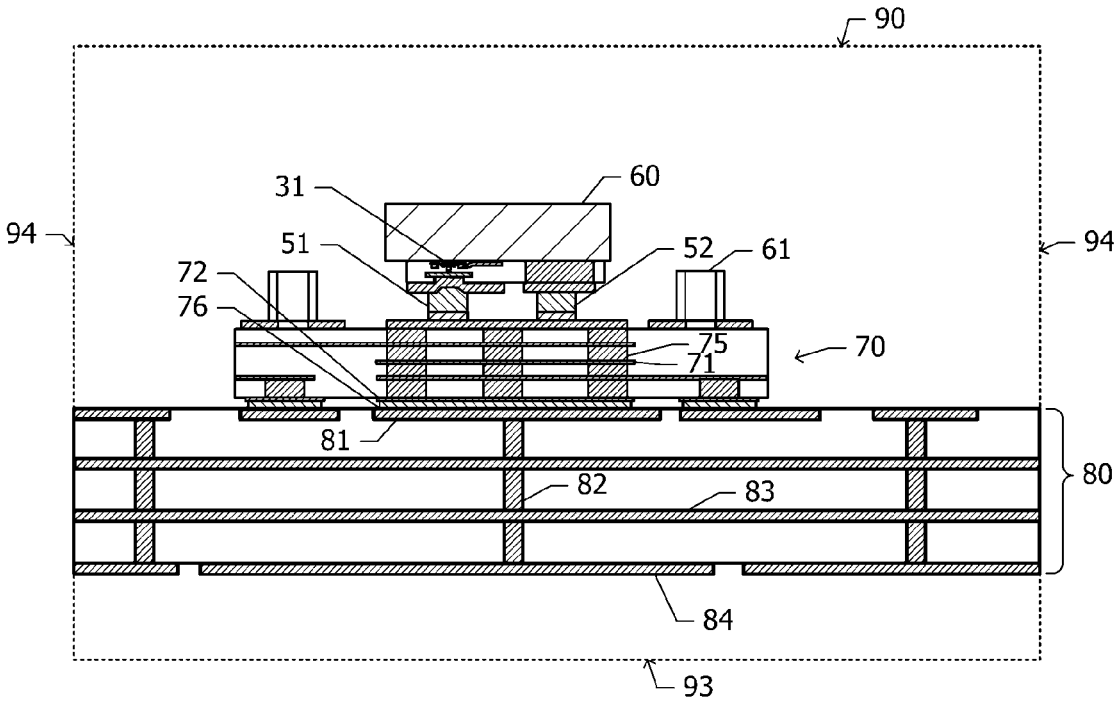
FIG. 12B is a schematic cross-sectional view of the system according to the second example.

FIG. 12A is a diagram illustrating a positional relationship among a plurality of constituents of the system according to the second example in the plan view, and FIG. 12B is a schematic cross-sectional view taken along a dot-dashed line 12B-12B in FIG. 12A. The semiconductor device 60 is mounted face-down on the module board 70. A semiconductor module including the semiconductor device 60 and the module board 70 is mounted on the system board 80.

The system board 80 includes a system ground conductor 81 disposed on a mounting surface, a plurality of in-layer ground conductors 83 disposed in a layer, an inner surface ground conductor 84 disposed on an inner surface on a side opposite to the mounting surface, and a plurality of vias 82. The inner surface ground conductor 72 of the module board 70 is electrically and thermally connected to the system ground conductor 81 of the system board 80 through the solder layer 76. The heat generated by the first transistor 31 of the semiconductor device 60 is conducted to the module board 70 through the first conductor protrusion 51 or the second conductor protrusion 52 and is further conducted to the system board 80.

Next, a result of a simulation of heat dissipation characteristics of the system according to the second example will be described. The imaginary plane 90 positioned above the mounting surface of the module board 70 by approximately 1 mm and an imaginary plane 93 positioned below the inner surface of the system board 80 by approximately 1 mm are set as infinite heat dissipation planes having ideal heat dissipation, and imaginary planes 94 surrounding the system board 80 in the plan view are set as heat insulating planes. A cavity part of a space surrounded by the imaginary planes 90, 93, and 94 is filled with air. The collector mesas 31BC (FIGS. 4A and 4B) of the plurality of first transistors 31 are set as heat generation sources.

Conditions of the thermal conductivity of each constituent of the semiconductor device 60 and the module board 70 are the same as the conditions in the simulation of the result illustrated in FIG. 7. Thermal conductivity of an insulating layer part of the system board 80 is set to 0.4 W/Km, considering a glass epoxy resin called FR4. Thermal conductivity of a conductor part of the system board 80 is set to 390 W/K·m, considering Cu.

FIG. 13 is a graph illustrating a result of a simulation of a rate of change in thermal resistance using thermal resistance in a case where the inter-center distance Dy (FIG. 2) is zero as a reference. Physical quantities denoted by a horizontal axis and a vertical axis of the graph illustrated in FIG. 13 are the same as the physical quantities denoted by the horizontal axis and the vertical axis of the graph illustrated in FIG. 7.

A solid line in the graph illustrated in FIG. 13 illustrates the rate of change in thermal resistance in a state where the module board 70 is not mounted on the system board 80, and is the same as that in the graph illustrated in FIG. 7. A broken line in the graph illustrated in FIG. 13 illustrates the rate of change in thermal resistance in a state where the module board 70 is mounted on the system board 80.

As in the case illustrated in FIG. 7, thermal resistance is decreased in a case where the interval Gp between the first conductor protrusion 51 and the second conductor protrusion 52 is increased. In a state where the semiconductor module including the semiconductor device 60 and the module board 70 is not mounted on the system board 80, thermal resistance changes to be increased in a case where the interval Gp exceeds approximately 225 µm. Meanwhile, in a state where the semiconductor module is mounted on the system board 80, thermal resistance tends to be decreased in accordance with an increase in the interval Gp even in a case where the interval Gp exceeds 225 µm. Next, advantageous effects of the second example will be described.

Mounting the semiconductor module on the system board 80 as in the second example causes the system board 80 to function as a heat sink, and heat dissipation from the semiconductor device 60 can be improved. In addition, in a case where the semiconductor module is assumed to be mounted on the system board 80, it is preferable to set the interval Gp between the first conductor protrusion 51 and the second conductor protrusion 52 to be greater than or equal to 55 µm, and an effect of improvement in heat dissipation can be obtained even in a case where the second conductor protrusion 52 is disposed in an end portion of the second member 20 (FIG. 1).

Third Example

Next, a semiconductor module according to a third example will be described with reference to the drawings of FIGS. 14A to 15. Configurations common to the semiconductor device according to the first example described with reference to the drawings of FIGS. 1 to 9 will not be described below. In the first example (FIG. 2), 26 first transistors 31 are divided into two blocks, each of which is configured with 13 first transistors 31. Meanwhile, in the third example, the number of first transistors 31 is not limited to 26.

The drawings of FIGS. 14A to 14F are diagrams illustrating a positional relationship between the plurality of first transistors 31 and two first conductor protrusions 51 of a semiconductor device according to the third example in the plan view.

Figures 14A, 14B, 14C, 14D, 14E, 14F:
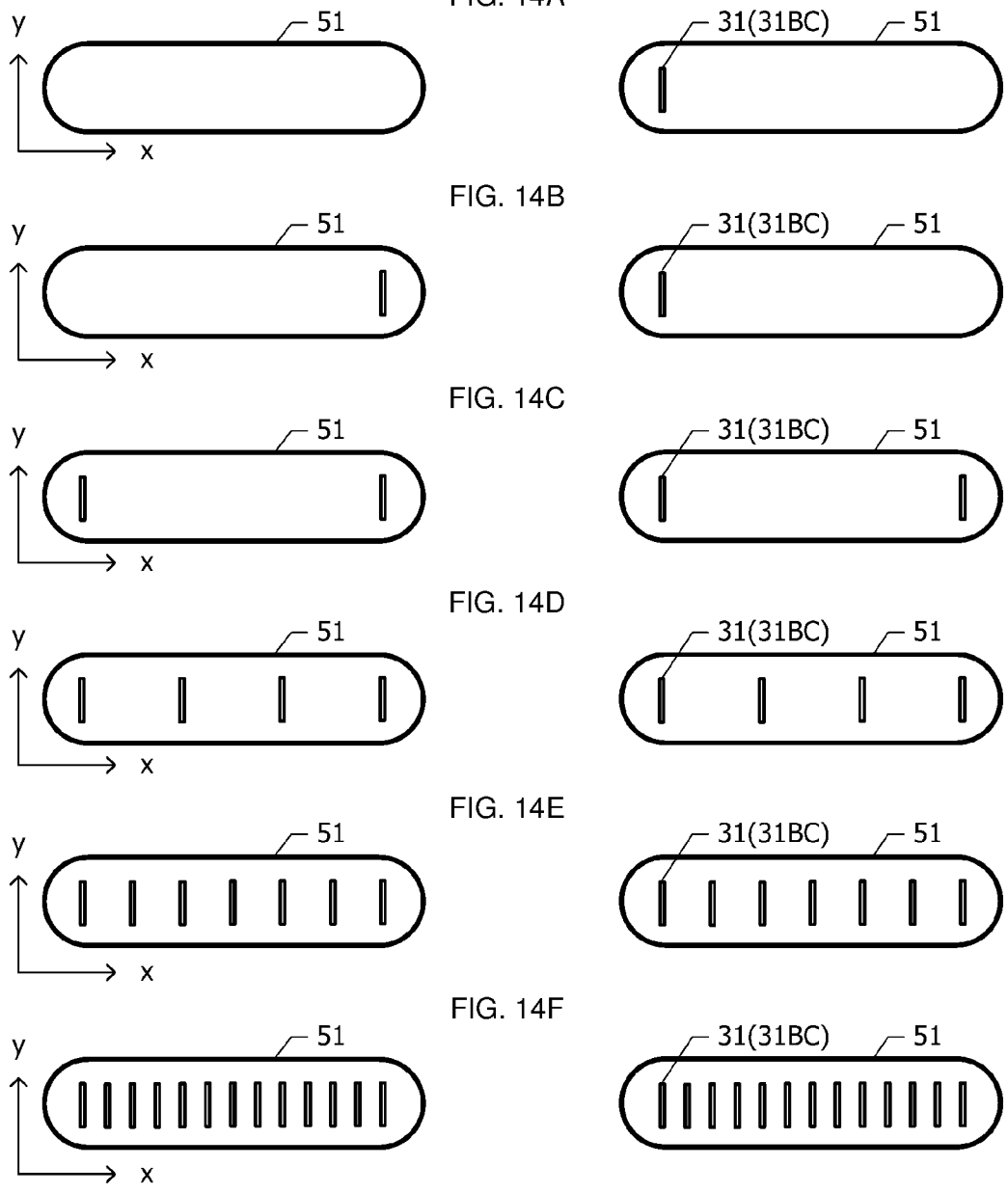
FIGS. 14A to 14F are diagrams illustrating a positional relationship between a plurality of first transistors and two first conductor protrusions of a semiconductor device according to a third example in the plan view.

In FIG. 14F, 26 first transistors 31 are arranged in a row in the x direction and are divided into two blocks, as in the semiconductor device according to the first example. Even in the examples illustrated in any drawing of FIGS. 14A to 14E, two first conductor protrusions 51 are disposed, as in the first example (FIG. 14F).

In the example illustrated in FIG. 14A, the number of first transistors 31 is one. The one first transistor 31 corresponds to the first transistor 31 positioned at an end on one block side of the 13 first transistors 31 belonging to the other block illustrated in FIG. 14F. In the example illustrated in FIG. 14B, the number of first transistors 31 is two. The two first transistors 31 correspond to the first transistors 31 positioned at ends on the other block side of the 13 first transistors 31 included in each of the two blocks illustrated in FIG. 14F. In the example illustrated in FIG. 14C, the number of first transistors 31 is four. The four first transistors 31 correspond to the two first transistors 31 positioned at both ends of the 13 first transistors 31 of each of the two blocks illustrated in FIG. 14F.

In the example illustrated in FIG. 14D, the number of first transistors 31 is eight. The eight first transistors 31 correspond to the four first transistors 31 extracted at intervals of three from the 13 first transistors 31 belonging to each of the two blocks illustrated in FIG. 14F. In the example illustrated in FIG. 14E, the number of first transistors 31 is 14. The 14 first transistors 31 correspond to the first transistors 31 extracted at intervals of one from the 13 first transistors 31 included in each of the two blocks illustrated in FIG. 14F.

Figure 15:
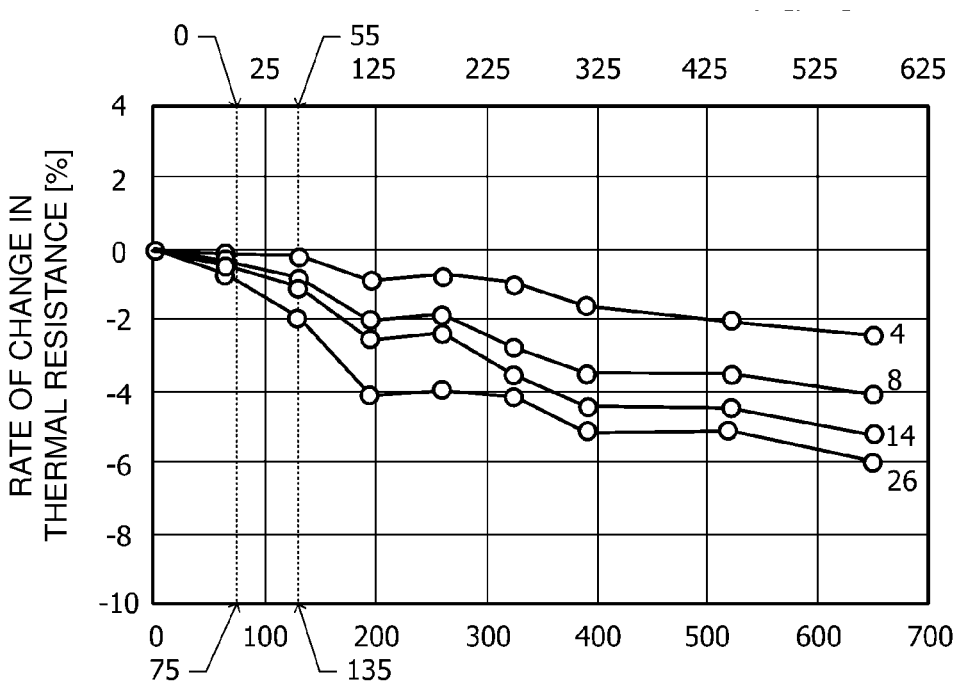
FIG. 15 is a graph illustrating a result of a simulation of a rate of change in thermal resistance using thermal resistance in a case where the inter-center distance Dy is zero as a reference in the semiconductor device according to the third example.

FIG. 15 is a graph illustrating a result of a simulation of a rate of change in thermal resistance using thermal resistance in a case where the inter-center distance Dy (FIG. 2) is zero as a reference. Physical quantities denoted by a horizontal axis and a vertical axis of the graph illustrated in FIG. 15 are the same as the physical quantities of the horizontal axis and the vertical axis of the graph illustrated in FIG. 7. A number at a right end of each solid line in the graph in FIG. 15 indicates the number of first transistors 31. An effect of reduction in thermal resistance can be obtained by setting the interval Gp between the first conductor protrusion 51 and the second conductor protrusion 52 to be greater than or equal to 55 µm. In addition, as the number of first transistors 31 is increased, the effect of reduction in thermal resistance is increased.

Next, advantageous effects of the third example will be described.

For example, in a configuration in which the number of first transistors 31 is greater than or equal to four as in the third example, setting the interval Gp between the first conductor protrusion 51 and the second conductor protrusion 52 to be greater than or equal to 55 µm can reduce thermal resistance and improve heat dissipation.

Fourth Example

Next, a semiconductor device according to a fourth example will be described with reference to FIGS. 16 and 17. Configurations common to the semiconductor device according to the first example described with reference to the drawings of FIGS. 1 to 9 will not be described below.

Figure 16:
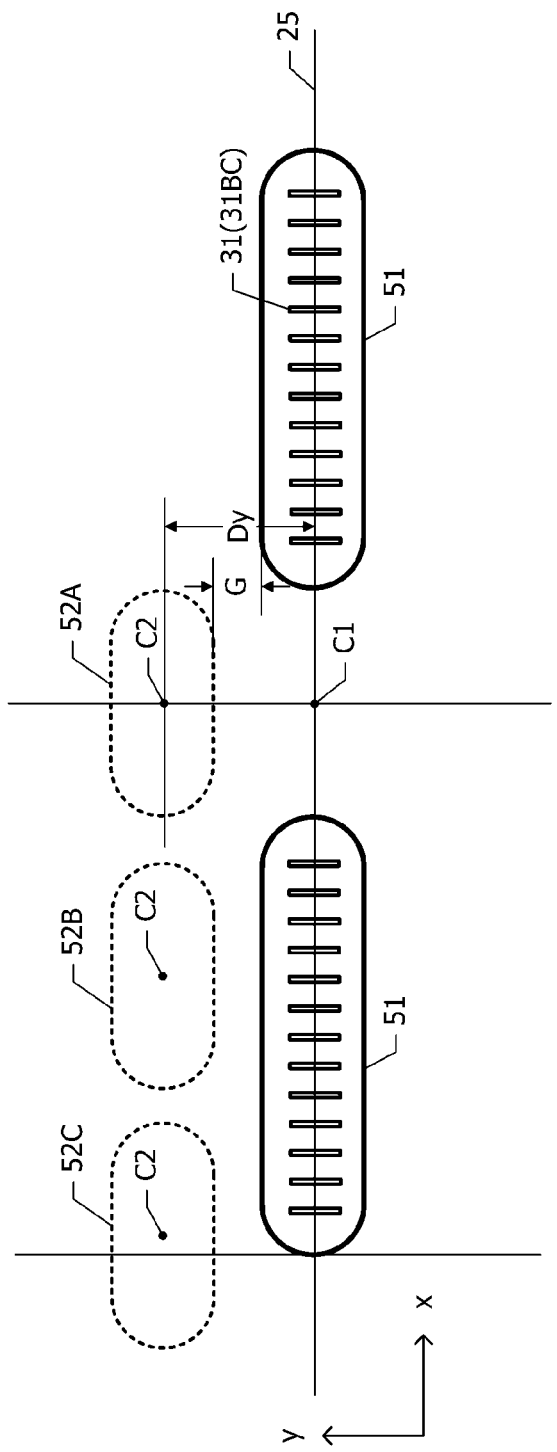
FIG. 16 is a diagram illustrating a positional relationship between a first conductor protrusion of a semiconductor device according to a fourth example and a position at which a second conductor protrusion is disposed in the plan view.

FIG. 16 is a diagram illustrating a positional relationship between the first conductor protrusion 51 of the semiconductor device according to the fourth example and positions 52A, 52B, and 52C at which the second conductor protrusion 52 is disposed in the plan view. Disposition of the two first conductor protrusions 51 and the plurality of first transistors 31 is the same as that in the first example (FIG. 2). In the first example, the second conductor protrusion 52 is disposed at the position 52A. That is, a position of the geometric center C1 of the two first conductor protrusions 51 in the x direction in the plan view matches a position of the geometric center C2 of the second conductor protrusion 52 in the x direction in the plan view. Hereinafter, the expression "geometric center in the plan view" may be simply referred to as "geometric center"

In the fourth example, the second conductor protrusion 52 is disposed at the positions 52B, 52C, and the like. That is, the position of the geometric center C2 of the second conductor protrusion 52 is shifted in the x direction from the position of the geometric center C1 of the two first conductor protrusions 51. The geometric center C2 of the second conductor protrusion 52 disposed at the position 52C has a larger amount of shift in the x direction than the geometric center C2 of the second conductor protrusion 52 disposed at the position 52B.

For example, in the x direction, a range occupied by the second conductor protrusion 52 disposed at the position 52B is included in a range occupied by one first conductor protrusion 51. In the x direction, a part of a range occupied by the second conductor protrusion 52 disposed at the position 52C overlaps with a part of the range occupied by the one first conductor protrusion 51. More specifically, an imaginary plane that passes through an end portion of the one first conductor protrusion 51 on a side farthest from the geometric center C1 and that is orthogonal to the imaginary straight line 25 intersects with the second conductor protrusion 52 at the position 52C.

Figure 17:
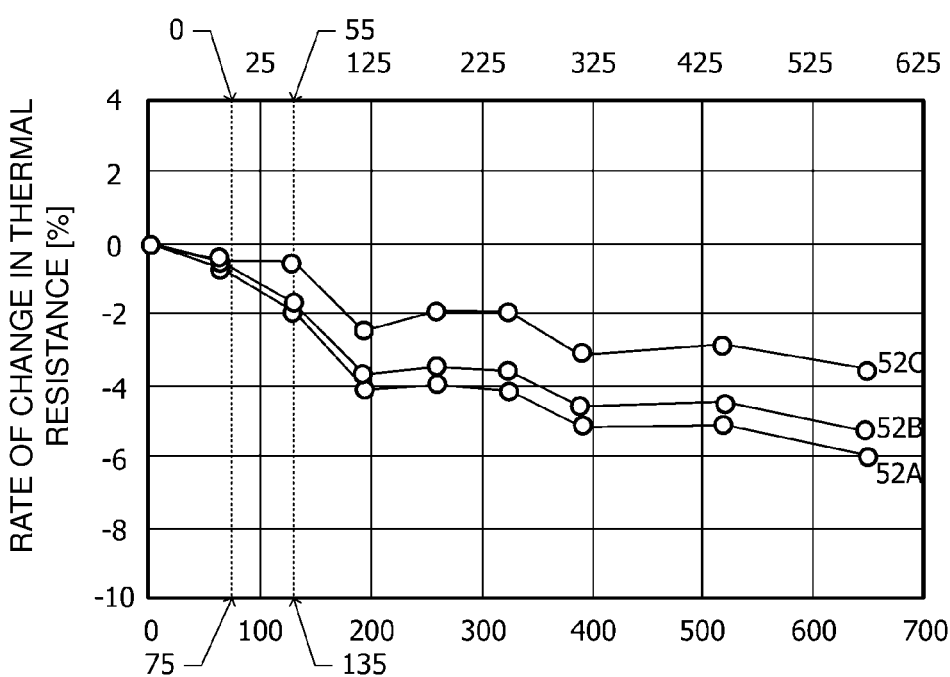
FIG. 17 is a graph illustrating a result of a simulation of a rate of change in thermal resistance using thermal resistance in a case where the inter-center distance Dy is zero as a reference in the semiconductor device according to the fourth example.

FIG. 17 is a graph illustrating a result of a simulation of a rate of change in thermal resistance using thermal resistance in a case where the inter-center distance Dy (FIG. 2) is zero as a reference. Physical quantities denoted by a horizontal axis and a vertical axis of the graph illustrated in FIG. 17 are the same as the physical quantities of the horizontal axis and the vertical axis of the graph illustrated in FIG. 7. A reference numeral at a right end of each solid line in the graph in FIG. 17 indicates the positions 52A, 52B, and 52C of the second conductor protrusion 52 illustrated in FIG. 16. It is perceived that in the x direction, the effect of reduction in thermal resistance can be obtained even in a case where the geometric center C2 of the second conductor protrusion 52 is shifted in the x direction from the geometric center C1 of the two first conductor protrusions 51. The effect of reduction in thermal resistance is maximized in a case where the position of the geometric center C2 of the second conductor protrusion 52 in the x direction matches the position of the geometric center C1 of the two first conductor protrusions 51 in the x direction.

Next, advantageous effects of the fourth example will be described.

The effect of reduction in thermal resistance can be obtained even in a case where the geometric center C2 of the second conductor protrusion 52 is shifted in the x direction from the geometric center C1 of the two first conductor protrusions 51, as in the fourth example. However, in a case where the amount of shift in the x direction is excessively increased, the effect of reduction in thermal resistance is considered to be decreased. In order to obtain a sufficient effect of reduction in thermal resistance, it is preferable to dispose the second conductor protrusion 52 such that at least a part of the second conductor protrusion 52 is positioned in a range in which the first conductor protrusion 51 is distributed in the x direction. The expression "range in which the first conductor protrusion 51 is distributed in the x direction" means a range occupied by the minimum convex polygon (convex hull) of the first conductor protrusion 51 in the plan view.

From the graph illustrated in FIG. 17, it is considered that a sufficient effect of reduction in thermal resistance can be obtained even in a case where the geometric center C2 of the second conductor protrusion 52 is shifted by 650 μm in the y direction from the geometric center C1 of the first conductor protrusions 51. Accordingly, it is considered that a sufficient effect of reduction in thermal resistance can be obtained in a case where the amount of shift in the x direction from the geometric center C1 of the two first conductor protrusions 51 to the geometric center C2 of the second conductor protrusion 52 is less than or equal to 650 μm.

Next, a semiconductor device according to a modification example of the fourth example will be described.

In the fourth example, the geometric center C2 of the second conductor protrusion 52 is shifted in the y direction and the x direction with respect to the geometric center C1 of the two first conductor protrusions 51. As another configuration, more generally, the geometric center C2 of the second conductor protrusion 52 may be shifted in any direction of in-plane directions of the first surface 10A with respect to the geometric center C1 of the minimum convex polygon of one or a plurality of first conductor protrusions 51. In this case, an interval between the minimum convex polygon of the one or the plurality of first conductor protrusions 51 and the in-plane direction of the second conductor protrusion 52 may be set to be greater than or equal to 55 μm.

Fifth Example

Next, a semiconductor device according to a fifth example will be described with reference to FIGS. 18 and 19. Configurations common to the semiconductor device according to the first example described with reference to the drawings of FIGS. 1 to 9 will not be described below. While the radio frequency amplifier circuit of one stage has been described in the first example, a radio frequency amplifier circuit according to the fifth example has a two-stage configuration.

Figure 18:
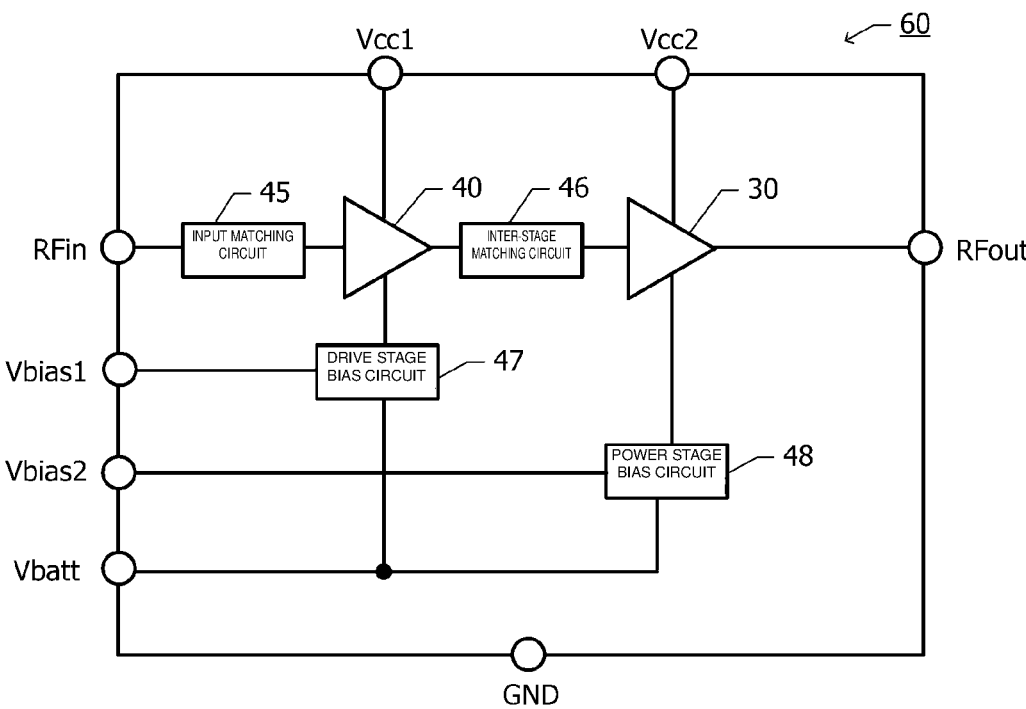
FIG. 18 is a block diagram illustrating functions of a semiconductor device according to a fifth example.

FIG. 18 is a block diagram illustrating functions of the semiconductor device according to the fifth example. The semiconductor device 60 according to the fifth example includes a drive stage amplifier circuit 40, a power stage amplifier circuit 30, an input matching circuit 45, an inter-stage matching circuit 46, a drive stage bias circuit 47, and a power stage bias circuit 48. Furthermore, the semiconductor device according to the fifth example includes, as external connection terminals configured with conductor protrusions (for example, bumps), a radio frequency signal input terminal RFin, a radio frequency signal output terminal RFout, a drive stage bias control terminal Vbias1, a power stage bias control terminal Vbias2, power supply terminals Vcc1 and Vcc2, a bias power supply terminal Vbatt, and a ground terminal GND. While only one ground terminal GND is illustrated in the block diagram in FIG. 18, a plurality of ground terminals GND are actually disposed.

A radio frequency signal input from the radio frequency signal input terminal RFin is input into the drive stage amplifier circuit 40 through the input matching circuit 45. The radio frequency signal amplified by the drive stage amplifier circuit 40 is input into the power stage amplifier circuit 30 through the inter-stage matching circuit 46. The radio frequency signal amplified by the power stage amplifier circuit 30 is output from the radio frequency signal output terminal RFout. The ground terminal GND includes, for example, the first conductor protrusion 51 (FIG. 1). The radio frequency signal output terminal RFout corresponds to the output conductor protrusion 55 (FIG. 3A).

A power supply voltage is applied to the drive stage amplifier circuit 40 and the power stage amplifier circuit 30 from the power supply terminals Vcc1 and Vcc2, respectively. A bias power supply voltage is supplied to the drive stage bias circuit 47 and the power stage bias circuit 48 from the bias power supply terminal Vbatt. The drive stage bias circuit 47 supplies a bias to the drive stage amplifier circuit 40 based on a bias control signal input into the drive stage bias control terminal Vbias1. The power stage bias circuit 48 supplies a bias to the power stage amplifier circuit 30 based on a bias control signal input into the power stage bias control terminal Vbias2.

Figure 19:
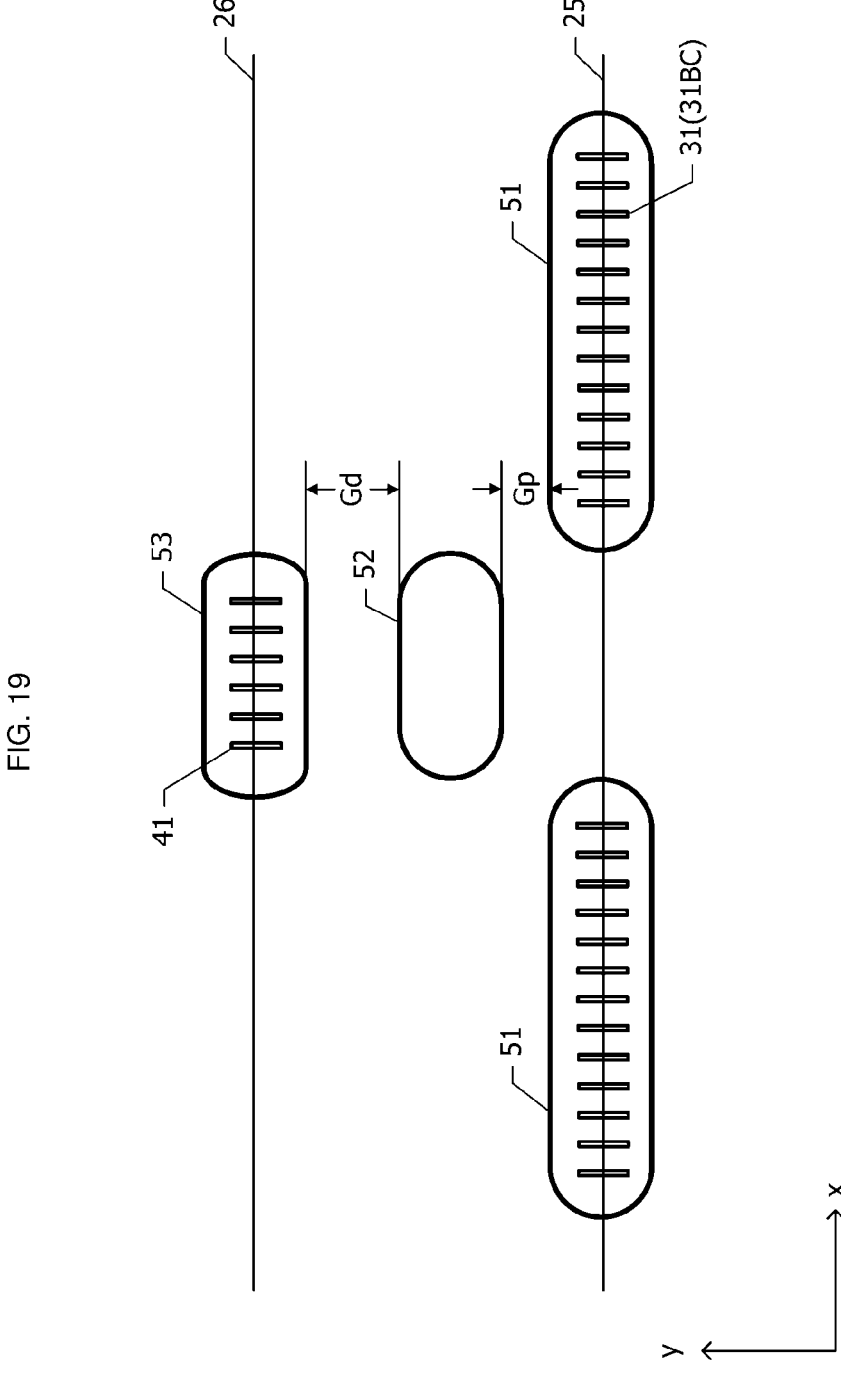
FIG. 19 is a diagram illustrating a positional relationship among a plurality of first transistors of a power stage amplifier circuit, a plurality of second transistors of a drive stage amplifier circuit, a first conductor protrusion, a second conductor protrusion, and a third conductor protrusion in the plan view.

FIG. 19 is a diagram illustrating a positional relationship among the plurality of first transistors 31 of the power stage amplifier circuit 30, a plurality of second transistors 41 of the drive stage amplifier circuit 40, the first conductor protrusion 51, the second conductor protrusion 52, and a third conductor protrusion 53 in the plan view. A positional relationship among the plurality of first transistors 31, the two first conductor protrusions 51, and the second conductor protrusion 52 is the same as the positional relationship among them of the semiconductor device in the first example (FIG. 2).

The plurality of second transistors 41 of the drive stage amplifier circuit 40 are arranged along, for example, an imaginary straight line 26 parallel to the x direction. In FIG. 19, the second transistors 41 indicate shapes of collector mesas of the second transistors 41 in the plan view, as in FIG. 2. The third conductor protrusion 53 is disposed such that the third conductor protrusion 53 includes the plurality of second transistors 41 in the plan view. A basic configuration of each of the second transistors 41 is the same as the basic configuration of each of the first transistors 31. The third conductor protrusion 53 is electrically connected to emitters of the plurality of second transistors 41.

The second conductor protrusion 52 is disposed between the imaginary straight line 25 along which the plurality of first transistors 31 are arranged and the imaginary straight line 26 along which the plurality of second transistors 41 are arranged. An interval between the third conductor protrusion 53 and the second conductor protrusion 52 in the y direction will be denoted by Gd. The interval Gd is set to be greater than or equal to 55 µm like the interval Gp.

Next, advantageous effects of the fifth example will be described. Setting the interval Gd to be greater than or equal to 55 µm causes the second conductor protrusion 52 to function as the heat dissipation path from the second transistors 41, and heat dissipation can be improved. Accordingly, heat dissipation from the plurality of first transistors 31 of the power stage amplifier circuit 30 and the plurality of second transistors 41 of the drive stage amplifier circuit 40 can be improved.

Next, a semiconductor device according to a modification example of the fifth example will be described.

In the fifth example, one second conductor protrusion 52 (FIG. 19) is used as the heat dissipation path from the plurality of first transistors 31 of the power stage amplifier circuit 30 and the heat dissipation path from the plurality of second transistors 41 of the drive stage amplifier circuit 40. As another configuration, another second conductor protrusion 52 used as the heat dissipation path from the plurality of second transistors 41 of the drive stage amplifier circuit 40 may be provided separately from the second conductor protrusion 52 used as the heat dissipation path from the plurality of first transistors 31 of the power stage amplifier circuit 30.

Sixth Example

Next, a semiconductor device according to a sixth example will be described with reference to FIG. 20. Configurations common to the semiconductor device according to the first example described with reference to the drawings of FIGS. 1 to 9 will not be described below.

Figure 20:
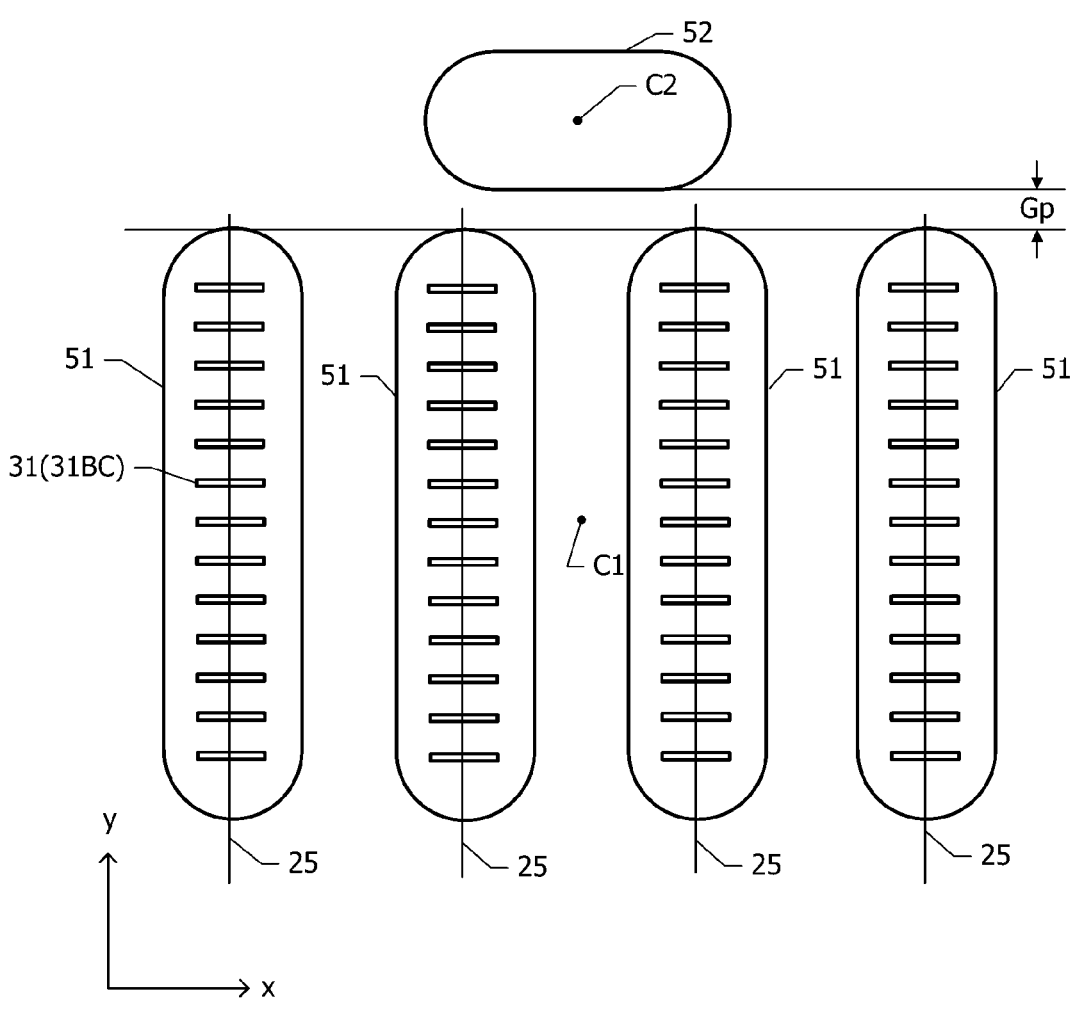
FIG. 20 is a diagram illustrating a positional relationship among a plurality of first transistors, a plurality of first conductor protrusions, and a second conductor protrusion of a semiconductor device according to a sixth example in the plan view.

FIG. 20 is a diagram illustrating a positional relationship among the plurality of first transistors 31, a plurality of first conductor protrusions 51, and the second conductor protrusion 52 of the semiconductor device according to the sixth example in the plan view. In the first example (FIG. 2), the plurality of first transistors 31 are arranged along one imaginary straight line 25, and each of the collector mesas 31BC of the first transistors 31 is long in a direction orthogonal to the imaginary straight line 25 in the plan view. Meanwhile, in the sixth example, the plurality of first transistors 31 are arranged along each of a plurality of, for example, four, imaginary straight lines 25 parallel to each other. Each of the collector mesas 31BC of the first transistors 31 is long in a direction orthogonal to the imaginary straight lines 25 in the plan view.

An xy orthogonal coordinate system in which a direction parallel to the imaginary straight lines 25 is the y direction and a plane parallel to the first surface 10A (FIG. 1) of the first member 10 is the xy plane is defined. Four first conductor protrusions 51 are disposed such that the first conductor protrusions 51 include the plurality of first transistors 31 along each of the four imaginary straight lines 25 in the plan view. Each of the first conductor protrusions 51 has a shape that is long in the y direction in the plan view.

Positions of end portions of the four first conductor protrusions 51 on a negative side of the y axis in the y direction match each other, and positions of end portions of the four first conductor protrusions 51 on a positive side of the y axis in the y direction also match each other. The second conductor protrusion 52 is disposed at an interval in the y direction from a region in which the four first conductor protrusions 51 are distributed (a region inside the minimum convex polygon of the four first conductor protrusions 51). The interval Gp between the four first conductor protrusions 51 and the second conductor protrusion 52 in the y direction is greater than or equal to 55 µm, as in the first example.

Positions of the geometric center C1 of the four first conductor protrusions 51 and the geometric center C2 of the second conductor protrusion 52 in the x direction match each other. As described with reference to FIGS. 16 and 17, the position of the geometric center C2 may be shifted in the x direction from the position of the geometric center C1.

Next, advantageous effects of the sixth example will be described.

As in the sixth example, the plurality of first transistors 31 do not need to be arranged along one imaginary straight line 25 and may be arranged along each of the plurality of imaginary straight lines 25. Even in this case, setting the interval Gp to be greater than or equal to 55 µm can improve heat dissipation.

Seventh Example

Next, a semiconductor device according to a seventh example will be described with reference to FIGS. 21, 22A, and 22B. Configurations common to the semiconductor device according to the first example described with reference to the drawings of FIGS. 1 to 9 will not be described below.

Figure 21:
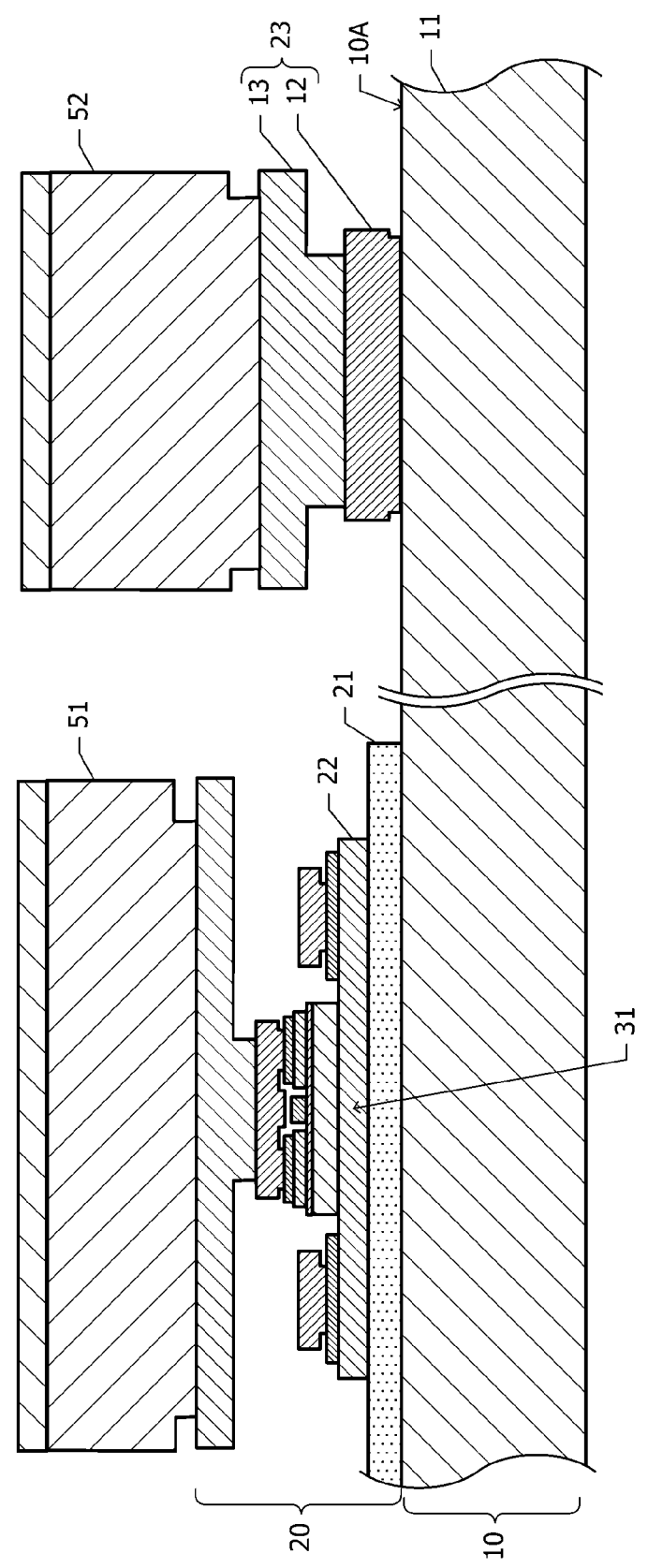
FIG. 21 is a schematic cross-sectional view of a semiconductor device according to a seventh example.

FIG. 21 is a schematic cross-sectional view of the semiconductor device according to the seventh example. In the first example (FIG. 1), the second conductor protrusion 52 is disposed at a position included in the second member 20 in the plan view. Meanwhile, in the seventh example, the second conductor protrusion 52 is disposed at a position that is on an outer side portion of the second member 20 and that is included in the first member 10 in the plan view.

The second conductor protrusion 52 is connected to the first semiconductor board 11 of the first member 10 through the connection part 23 configured with a semiconductor layer, a metal layer, or a laminate of a semiconductor layer and a metal layer. For example, the connection part 23 is configured with a metal layer 12 that is in contact with the first semiconductor board 11, and a metal layer 13 that is in contact with the metal layer 12 and the second conductor protrusion 52. The metal layers 12 and 13 may be formed before bonding the second member 20 to the first member 10 or may be formed after the bonding.

The heat generated by the first transistors 31 dissipates through the first conductor protrusion 51 and dissipates through the subcollector layer 22, the second semiconductor board 21, the first semiconductor board 11, the connection part 23, and the second conductor protrusion 52.

Next, examples of a conductor protrusion that is not suitable for use for heat dissipation will be described with reference to FIGS. 22A and 22B. FIGS. 22A and 22B are cross-sectional views of the conductor protrusion that is not suitable for use for heat dissipation.

Figure 22A:
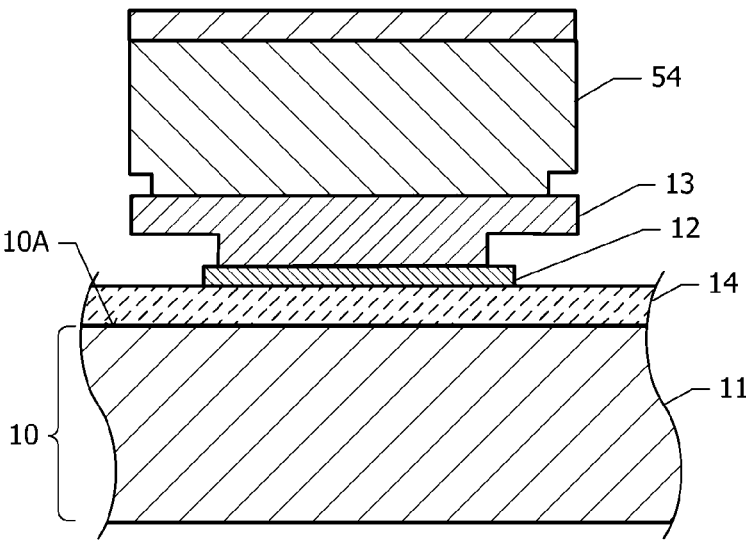
FIGS. 22A and 22B are cross-sectional views of a conductor protrusion that is not suitable for use for heat dissipation.
Figure 22B:
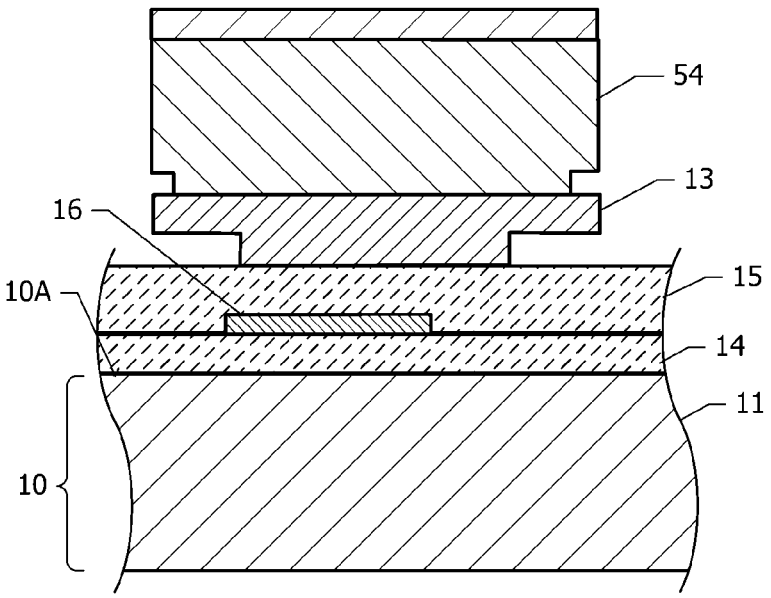

In the example illustrated in FIG. 22A, an insulating layer 14 is disposed between a conductor protrusion 54 and the first semiconductor board 11 of the first member 10. In the example illustrated in FIG. 22B, the insulating layer 14, a metal pattern 16, and an insulating layer 15 are disposed between the conductor protrusion 54 and the first semiconductor board 11 of the first member 10. In any of the configurations, the insulating layer is disposed across the entire conductor protrusion 54 in the plan view. Thus, the shortest heat transfer path from the conductor protrusion 54 to the first semiconductor board 11 (a heat transfer path perpendicular to the first surface 10A of the first member 10) always passes through the insulating layer. Generally, thermal conductivity of the insulating layer is lower than thermal conductivity of a semiconductor or a metal. Thus, the conductor protrusion 54 is not suitable for use for heat dissipation.

In the configuration illustrated in FIG. 21, the shortest heat transfer path between the second conductor protrusion 52 and the first semiconductor board 11 does not pass through an insulating material. Thus, thermal resistance from the first semiconductor board 11 to the second conductor protrusion 52 can be reduced, and heat dissipation using the heat dissipation path that passes through the second conductor protrusion 52 from the first transistors 31 can be improved.

Each of the above examples is an example, and configurations illustrated in different examples can, of course, be partially replaced or combined with each other. The same action and operation of the same configuration of a plurality of examples are not repeated for each example. Furthermore, the present disclosure is not limited to the above examples. For example, those skilled in the art may perceive that various changes, improvements, and combinations can be made.

The following disclosure is disclosed based on the examples according to the present specification.

<1> A semiconductor device including a composite board including a first member and a second member provided on a first surface that is one surface of the first member, a first conductor protrusion that protrudes from the second member in a direction in which the first surface faces, and a second conductor protrusion that protrudes from the composite board in the direction in which the first surface faces. The first member includes a first semiconductor board. The second member includes a second semiconductor board having lower thermal conductivity than the first semiconductor board. A radio frequency amplifier circuit including a plurality of first transistors is provided in the second member. The first conductor protrusion is electrically connected to the plurality of first transistors and at least partially overlaps with the plurality of first transistors in a plan view of the first surface. The composite board includes a connection part that reaches the first semiconductor board or the second semiconductor board from the second conductor protrusion. In the plan view of the first surface, the connection part reaches the first semiconductor board or the second semiconductor board from the second conductor protrusion in a region in which the connection part at least partially overlaps with the second conductor protrusion, and is configured with a semiconductor material, a conductive material, or a laminate of a semiconductor material and a conductive material, and the second conductor protrusion is disposed to be separated by greater than or equal to 55 μm from the first conductor protrusion in an in-plane direction of the first surface.

<2> The semiconductor device according to <1>, in which the plurality of first transistors are arranged along one imaginary straight line, and the second conductor protrusion is disposed to be separated by greater than or equal to 55 μm from the first conductor protrusion in a direction orthogonal to the imaginary straight line.

<3> The semiconductor device according to <2>, in which the second conductor protrusion is disposed in a range in which the plurality of first transistors are distributed in a direction parallel to the imaginary straight line.

<4> The semiconductor device according to <1>, in which the plurality of first transistors belong to any of a plurality of blocks, and the plurality of first transistors belonging to each of the plurality of blocks are arranged along one imaginary straight line, and one first conductor protrusion is disposed for each of the plurality of blocks.

<5> The semiconductor device according to any one of <1> to <4>, in which the second conductor protrusion is thermally coupled to the plurality of first transistors through the connection part, the first semiconductor board, and the second semiconductor board.

<6> The semiconductor device according to any one of <1> to <5>, in which a drive stage amplifier circuit is further provided in the second member, and a radio frequency signal output from the drive stage amplifier circuit is input into the radio frequency amplifier circuit. The drive stage amplifier circuit includes one or a plurality of second transistors connected in parallel with each other. The semiconductor device further includes a third conductor protrusion that protrudes from the second member in the direction in which the first surface faces. The third conductor protrusion is electrically connected to the second transistor and at least partially overlaps with the second transistor in the plan view of the first surface, and the second conductor protrusion is disposed to be separated by greater than or equal to 55 μm from the third conductor protrusion in the in-plane direction of the first surface.

<7> A semiconductor module including the semiconductor device according to any one of <1> to <6>, and a module board on which the semiconductor device is mounted, in which the module board includes a ground conductor disposed in a layer, and a plurality of ground lands disposed on an outer surface, and the first conductor protrusion and the second conductor protrusion are connected to the respective ground lands.

<8> A system including the semiconductor module according to <7>, and a system board on which the semiconductor module is mounted. The module board includes an inner surface ground conductor disposed on a surface on a side opposite to a surface on which the ground lands are disposed, and a plurality of vias that electrically connect the ground lands to the inner surface ground conductor. The system board includes a system ground conductor disposed on an outer surface, and the semiconductor module is mounted on the system board by electrically connecting the inner surface ground conductor to the system ground conductor.

What is claimed is:

1. A semiconductor device comprising:

a composite board including a first member and a second member on a first surface that is one surface of the first member;

at least one first conductor protrusion that protrudes from the second member in a direction in which the first surface faces; and a second conductor protrusion that protrudes from the composite board in the direction in which the first surface faces, wherein the first member includes a first semiconductor board, the second member includes a second semiconductor board having lower thermal conductivity than the first semiconductor board, a radio frequency amplifier circuit including a plurality of first transistors is in the second member, the first conductor protrusion is electrically connected to the plurality of first transistors and at least partially overlaps with the plurality of first transistors in a plan view of the first surface, the composite board includes a connection part that reaches the first semiconductor board or the second semiconductor board from the second conductor protrusion, in the plan view of the first surface, the connection part reaches the first semiconductor board or the second semiconductor board from the second conductor protrusion in a region in which the connection part at least partially overlaps with the second conductor protrusion, and is configured with a semiconductor material, a conductive material, or a laminate of a semiconductor material and a conductive material, and the second conductor protrusion is separated by greater than or equal to 55 μm from the first conductor protrusion in an in-plane direction of the first surface.

2. The semiconductor device according to claim 1, wherein the plurality of first transistors are arranged along one imaginary straight line, and the second conductor protrusion is separated by greater than or equal to 55 μm from the first conductor protrusion in a direction orthogonal to the imaginary straight line.

3. The semiconductor device according to claim 2, wherein the second conductor protrusion is in a range in which the plurality of first transistors are distributed in a direction parallel to the imaginary straight line.

4. The semiconductor device according to claim 1, wherein the plurality of first transistors belong to any of a plurality of blocks, and the plurality of first transistors belonging to each of the plurality of blocks are arranged along one imaginary straight line, and one first conductor protrusion is disposed for each of the plurality of blocks.

5. The semiconductor device according to claim 1, wherein the second conductor protrusion is thermally coupled to the plurality of first transistors through the connection part, the first semiconductor board, and the second semiconductor board.

6. The semiconductor device according to claim 1, wherein a drive stage amplifier circuit is in the second member, and the drive stage amplifier circuit is configured to input a radio frequency signal into the radio frequency amplifier circuit, the drive stage amplifier circuit includes one or a plurality of second transistors connected in parallel with each other, the semiconductor device further includes a third conductor protrusion that protrudes from the second member in the direction in which the first surface faces, the third conductor protrusion is electrically connected to the second transistor and at least partially overlaps with the second transistor in the plan view of the first surface, and the second conductor protrusion is separated by greater than or equal to 55 μm from the third conductor protrusion in the in-plane direction of the first surface.

7. A semiconductor module comprising:

the semiconductor device according to claim 1; and a module board on which the semiconductor device is mounted, wherein the module board includes a ground conductor in a layer, and a plurality of ground lands on an outer surface, and the first conductor protrusion and the second conductor protrusion are connected to the respective ground lands.

8. A system comprising:

the semiconductor module according to claim 7; and a system board on which the semiconductor module is mounted, wherein the module board includes an inner surface ground conductor on a surface on a side opposite to a surface on which the ground lands are disposed, and a plurality of vias that electrically connect the ground lands to the inner surface ground conductor, the system board includes a system ground conductor on an outer surface, and the semiconductor module is mounted on the system board by electrically connecting the inner surface ground conductor to the system ground conductor.

9. The semiconductor device according to claim 2, wherein the second conductor protrusion is thermally coupled to the plurality of first transistors through the connection part, the first semiconductor board, and the second semiconductor board.

10. The semiconductor device according to claim 3, wherein the second conductor protrusion is thermally coupled to the plurality of first transistors through the connection part, the first semiconductor board, and the second semiconductor board.

11. The semiconductor device according to claim 4, wherein the second conductor protrusion is thermally coupled to the plurality of first transistors through the connection part, the first semiconductor board, and the second semiconductor board.

12. The semiconductor device according to claim 2, wherein a drive stage amplifier circuit is in the second member, and the drive stage amplifier circuit is configured to input a radio frequency signal into the radio frequency amplifier circuit, the drive stage amplifier circuit includes one or a plurality of second transistors connected in parallel with each other, the semiconductor device further includes a third conductor protrusion that protrudes from the second member in the direction in which the first surface faces, the third conductor protrusion is electrically connected to the second transistor and at least partially overlaps with the second transistor in the plan view of the first surface, and the second conductor protrusion is separated by greater than or equal to 55 μm from the third conductor protrusion in the in-plane direction of the first surface.

13. The semiconductor device according to claim 3, wherein a drive stage amplifier circuit is in the second member, and the drive stage amplifier circuit is configured to input a radio frequency signal into the radio frequency amplifier circuit, the drive stage amplifier circuit includes one or a plurality of second transistors connected in parallel with each other, the semiconductor device further includes a third conductor protrusion that protrudes from the second member in the direction in which the first surface faces, the third conductor protrusion is electrically connected to the second transistor and at least partially overlaps with the second transistor in the plan view of the first surface, and the second conductor protrusion is separated by greater than or equal to 55 μm from the third conductor protrusion in the in-plane direction of the first surface.

14. The semiconductor device according to claim 4, wherein a drive stage amplifier circuit is in the second member, and the drive stage amplifier circuit is configured to input a radio frequency signal into the radio frequency amplifier circuit, the drive stage amplifier circuit includes one or a plurality of second transistors connected in parallel with each other, the semiconductor device further includes a third conductor protrusion that protrudes from the second member in the direction in which the first surface faces, the third conductor protrusion is electrically connected to the second transistor and at least partially overlaps with the second transistor in the plan view of the first surface, and the second conductor protrusion is separated by greater than or equal to 55 μm from the third conductor protrusion in the in-plane direction of the first surface.

15. A semiconductor module comprising:
the semiconductor device according to claim 2; and
a module board on which the semiconductor device is mounted,
wherein the module board includes
a ground conductor in a layer, and
a plurality of ground lands on an outer surface, and
the first conductor protrusion and the second conductor protrusion are connected to the respective ground lands.

16. A semiconductor module comprising:
the semiconductor device according to claim 3; and
a module board on which the semiconductor device is mounted,
wherein the module board includes
a ground conductor in a layer, and
a plurality of ground lands on an outer surface, and
the first conductor protrusion and the second conductor protrusion are connected to the respective ground lands.

17. A semiconductor module comprising:
the semiconductor device according to claim 4; and
a module board on which the semiconductor device is mounted,
wherein the module board includes
a ground conductor in a layer, and
a plurality of ground lands on an outer surface, and
the first conductor protrusion and the second conductor protrusion are connected to the respective ground lands.

18. A system comprising:
the semiconductor module according to claim 15; and
a system board on which the semiconductor module is mounted,
wherein the module board includes
an inner surface ground conductor on a surface on a side opposite to a surface on which the ground lands are disposed, and
a plurality of vias that electrically connect the ground lands to the inner surface ground conductor,
the system board includes a system ground conductor on an outer surface, and
the semiconductor module is mounted on the system board by electrically connecting the inner surface ground conductor to the system ground conductor.

19. A system comprising:
the semiconductor module according to claim 17; and
a system board on which the semiconductor module is mounted,
wherein the module board includes
an inner surface ground conductor on a surface on a side opposite to a surface on which the ground lands are disposed, and
a plurality of vias that electrically connect the ground lands to the inner surface ground conductor,
the system board includes a system ground conductor on an outer surface, and
the semiconductor module is mounted on the system board by electrically connecting the inner surface ground conductor to the system ground conductor.

20. A system comprising:
the semiconductor module according to claim 17; and
a system board on which the semiconductor module is mounted,
wherein the module board includes
an inner surface ground conductor on a surface on a side opposite to a surface on which the ground lands are disposed, and
a plurality of vias that electrically connect the ground lands to the inner surface ground conductor,
the system board includes a system ground conductor on an outer surface, and
the semiconductor module is mounted on the system board by electrically connecting the inner surface ground conductor to the system ground conductor.

* * * * *